(12) United States Patent
Tsao et al.

(10) Patent No.: US 7,773,079 B2
(45) Date of Patent: Aug. 10, 2010

(54) METHOD AND RELATED DEVICE OF SOURCE DRIVER WITH REDUCED POWER CONSUMPTION

(75) Inventors: Wen-Yuan Tsao, Hsinchu County (TW); Chang-San Chen, Hsinchu (TW); Che-Li Lin, Taipei (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 742 days.

(21) Appl. No.: 11/695,051

(22) Filed: Apr. 1, 2007

(65) Prior Publication Data

US 2007/0229338 A1    Oct. 4, 2007

Related U.S. Application Data

(60) Provisional application No. 60/744,138, filed on Apr. 3, 2006.

(51) Int. Cl.
*G06F 3/038*    (2006.01)
(52) U.S. Cl. ...................................... 345/211
(58) Field of Classification Search ......... 345/211–213, 345/204–214
See application file for complete search history.

(56) References Cited

U.S. PATENT DOCUMENTS

| | | | | |
|---|---|---|---|---|
| 4,571,572 | A | * | 2/1986 | Noda et al. ................... 341/126 |
| 6,271,783 | B1 | * | 8/2001 | Cairns et al. ................. 341/144 |
| 2003/0030602 | A1 | | 2/2003 | Kasai |
| 2006/0119596 | A1 | * | 6/2006 | Lin ............................ 345/211 |
| 2006/0273850 | A1 | * | 12/2006 | Chang et al. ................... 330/51 |

FOREIGN PATENT DOCUMENTS

CN      1230795 C      12/2005

\* cited by examiner

*Primary Examiner*—David L Lewis
(74) *Attorney, Agent, or Firm*—Winston Hsu

(57) ABSTRACT

A method capable of reducing power consumption of source drivers is disclosed. The method includes a reference voltage source charging or discharging a loading end of a source driver to a reference voltage having a polarity the same as a polarity of a target voltage and a voltage level near a voltage level of the target voltage, and an output stage of the source driver charging or discharging the loading end to the target voltage.

20 Claims, 25 Drawing Sheets

| POL | Code | VT |
|---|---|---|
| 0 | 00 | V1 |
| 0 | 01 | V2 |
| 0 | 10 | V3 |
| 0 | 11 | V4 |
| 1 | 00 | V5 |
| 1 | 01 | V6 |
| 1 | 10 | V7 |
| 1 | 11 | V8 |

Fig. 7

| Code2[3:1] | V1 | V2 |
|---|---|---|
| 000 | Vref2[1] | Vref2[9] |
| 001 | Vref2[2] | Vref2[10] |
| 010 | Vref2[3] | Vref2[11] |
| 011 | Vref2[4] | Vref2[12] |
| 100 | Vref2[5] | Vref2[13] |
| 101 | Vref2[6] | Vref2[14] |
| 110 | Vref2[7] | Vref2[15] |
| 111 | Vref2[8] | Vref2[16] |

Fig. 11

| Code2[3:1] | V1 | V2 |
|---|---|---|
| 000 | Vref2[1] | Vref2[9] |
| 001 | Vref2[1] | Vref2[9] |
| 010 | Vref2[1] | Vref2[13] |
| 011 | Vref2[5] | Vref2[13] |
| 100 | Vref2[5] | Vref2[13] |
| 101 | Vref2[5] | Vref2[16] |
| 110 | Vref2[7] | Vref2[16] |
| 111 | Vref2[7] | Vref2[16] |

Fig. 12

| Code2[3:1] | V1 | V2 |
|---|---|---|
| 000 | Vref2[1] | Vref2[16] |
| 001 | Vref2[1] | Vref2[16] |
| 010 | Vref2[1] | Vref2[16] |
| 011 | Vref2[1] | Vref2[16] |
| 100 | Vref2[1] | Vref2[16] |
| 101 | Vref2[1] | Vref2[16] |
| 110 | Vref2[1] | Vref2[16] |
| 111 | Vref2[1] | Vref2[16] |

Fig. 13

METHOD AND RELATED DEVICE OF SOURCE DRIVER WITH REDUCED POWER CONSUMPTION

CROSS REFERENCE TO RELATED APPLICATIONS

This application claims the benefit of U.S. Provisional Application No. 60/744,138, filed Apr. 3, 2006, which is included herein by reference.

BACKGROUND OF THE INVENTION

1. Field of the Invention

The present invention is related to a method and related device of source drivers with reduced power consumption, and more particularly, to a method and related device utilizing a reference voltage source to charge or discharge a loading end of a source driver to a reference voltage.

2. Description of the Prior Art

Recently flat panel display (FPDs) with their flat, thin form factor and high-resolution image quality are getting more and more attention and undergoing explosive growth in the consumer market. The major types of FPDs include plasma display panels (PDP), liquid crystal displays (LCD), and rear projection displays These flat panel displays feature several shared benefits of thin form factor and high-resolution image quality and have already gradually replaced cathode ray tube displays (CRT). Hence, the flat panel displays are widely applied to information products such as notebook computers, personal digital assistants (PDA), flat televisions, and mobile phones.

Please refer to FIG. 1. FIG. 1 is a diagram of a source driver chip 10 utilizing charge sharing in the prior art. The source driver chip 10 includes N channels and is dot inversion. As a result, adjacent operational amplifiers have opposite polarities. For example, the $1^{st}$ operational amplifier OP+ has a positive polarity, and the $2^{nd}$ operational amplifier OP– has a negative polarity. Vref[R:1] represents R reference voltages provided to a digital-to-analog converter DAC, and the digital-to-analog converter DAC will subdivide many more voltage levels for usage by the operational amplifiers according to these reference voltages. Code[B:1] is gray-scale digital data desired to be displayed on the flat panel display, and is generated by a timing controller and is transmitted to the source drivers for buffering and usage. Please refer to the $1^{st}$ channel and the $2^{nd}$ channel, assuming that all operational amplifiers continuously alternate between a supply voltage AVDD and a grounding voltage GNDA. First, two adjacent loadings $Load_1$ and $Load_2$ outside the source driver chip 10 are shorted when performing charge sharing. At this time, a first switch $\phi1$ is turned on, and the charges of the two loadings $Load_1$ and $Load_2$ outside the source driver chip 10 will redistribute equally, whereof the voltage level after balancing is about one half of the supply voltage AVDD. After that, the first switch $\phi1$ is turned off and an output stage of the operational amplifier is electrically connected to corresponding loading outside the source driver chip 10, for example, the $1^{st}$ operational amplifier OP+ is coupled to the loading $Load_1$ outside the source driver chip 10 and the $2^{nd}$ operational amplifier OP– is coupled to the loading $Load_2$ outside the source driver chip 10. At this time, a second switch $\phi2$ is turned on. Hence, the operational amplifier will raise or lower the loading outside the source driver chip 10 to a target voltage (that is the supply voltage AVDD or the grounding voltage GNDA) to accomplish a complete driving operation.

Please refer to FIG. 2, which is a timing diagram of the source driver in FIG. 1. In this embodiment, charge sharing and 1-line dot inversion is adopted. A symbol POL represents a polarity signal of an operational amplifier OP, a symbol LD represents a start signal of the operational amplifier OP, and a symbol OUT represents a voltage level of the loading outside the source driver chip. The polarity of the operational amplifier OP is determined by buffering the polarity signal POL on a rising edge of the start signal LD. As shown in FIG. 2, if the polarity signal POL is buffered as 1 on the rising edge of the start signal LD, the polarity of the operational amplifier OP is a positive polarity. If the polarity signal POL is buffered as 0 on the rising edge of the start signal LD, the polarity of the operational amplifier OP is a negative polarity. During a period that the first switch $\phi1$ is turned on, the loading outside the source driver chip can be raised or lowered to $0.5\times AVDD$ through performing charge sharing. During a period that the second switch $\phi2$ is turned on, the operational amplifier OP is changed to drive the loading outside the source driver chip. At this time, there is still nearly a voltage level of $0.5\times AVDD$ to be driven.

Please refer to FIG. 3. FIG. 3 is another timing diagram of the source driver in FIG. 1. In this embodiment, charge sharing and 2-line dot inversion is adopted. The difference between FIG. 3 and FIG. 2 is that a switch frequency of the operational amplifier OP in FIG. 3 is only one half of the original switch frequency of the operational amplifier OP in FIG. 2. During the period that the first switch $\phi1$ is turned on, the loading outside the source driver chip can be raised or lowered to $0.5\times AVDD$ through performing charge sharing. During the period that the second switch $\phi2$ is turned on, the remnant $0.5\times AVDD$ is driven by the operational amplifier OP. But the polarity is not changed when the first switch $\phi1$ is turned on at the second time until the first switch $\phi1$ is turned on at the third time.

In the source driver architectures utilized in the flat panel displays on hand, charge sharing is adopted to save power consumption. First, two adjacent output ends with opposite polarities are shorted. Until the charges are redistributed equally, the output stages of the source drivers are connected to the output ends to perform charging and discharging on the loadings. The disadvantage of this method is that the loading still has a quite large charging distance to the target voltage after the charges redistribute equally, which will result in wasting much power when the output stage of the source driver charges and discharges the loading.

SUMMARY OF THE INVENTION

It is an objective of the present invention to provide a method and related device capable of reducing power consumption of source drivers to solve the above mentioned problems.

According to an embodiment of the present invention, a method capable of reducing power consumption of source drivers is disclosed. The method includes a reference voltage source charging or discharging a loading end of a source driver to a reference voltage having a polarity the same as a polarity of a target voltage and a voltage level near a voltage level of the target voltage, and an output stage of the source driver charging or discharging the loading end to the target voltage.

According to an embodiment of the present invention, a method capable of reducing power consumption of source drivers is disclosed. The method includes a first reference voltage source charging a loading end of a source driver to a first reference voltage having a polarity the same as a polarity of a first target voltage and a voltage level near a voltage level of the first target voltage, an output stage of the source driver charging or discharging the loading end to the first target voltage, a second reference voltage source discharging the loading end of the source driver to a second reference voltage having a polarity the same as a polarity of a second target voltage and a voltage level near a voltage level of the second target voltage, and the output stage of the source driver charging or discharging the loading end to the second target voltage.

According to an embodiment of the present invention, a method capable of reducing power consumption of source drivers is disclosed. The method includes sequentially delaying a first reference voltage in timing to generate a plurality of first voltage signals according to a start signal, sequentially delaying a second reference voltage in timing to generate a plurality of second voltage signals according to the start signal, charging a plurality of loading ends of a plurality of corresponding source drivers to the first reference voltage having a polarity the same as a polarity of a first target voltage and a voltage level near a voltage level of the first target voltage according to the plurality of first voltage signals, a plurality of output stages of the plurality of corresponding source drivers charging or discharging the plurality of corresponding loading ends to the first target voltage, discharging the plurality of loading ends of the plurality of corresponding source drivers to the second reference voltage having a polarity the same as a polarity of a second target voltage and a voltage level near a voltage level of the second target voltage according to the plurality of second voltage signals, and the plurality of output stages of the plurality of corresponding source drivers charging or discharging the plurality of corresponding loading ends to the second target voltage.

According to an embodiment of the present invention, a source driver with reduced power consumption is disclosed. The source driver includes a first pin, a second pin, a first digital-to-analog converter, an operational amplifier, an output stage, a first switch, a second switch, and a third switch. The first pin is used for inputting a first reference voltage and the second pin is used for inputting a second reference voltage. The operational amplifier is coupled to the first digital-to-analog converter. The first switch is coupled between the first pin and the output stage for controlling whether to electrically couple the output stage to the first pin, the second switch is coupled between the operational amplifier and the output stage for controlling whether to couple the output stage to electrically the operational amplifier, and the third switch is coupled between the second pin and the output stage for controlling whether to electrically couple the output stage to the second pin.

According to an embodiment of the present invention, a source driver with reduced power consumption is disclosed. The source driver includes a first digital-to-analog converter, an operational amplifier, an output stage, a first switch, and a second switch. The operational amplifier is coupled to the first digital-to-analog converter. The first switch is coupled between the first digital-to-analog converter and the output stage for controlling whether to electrically couple the output stage to the first digital-to-analog converter, and the second switch is coupled between the operational amplifier and the output stage for controlling whether to electrically couple the output stage to the operational amplifier. The first digital-to-analog converter selects a reference voltage from a plurality of reference voltages to output according to a polarity signal and a gray scale digital data.

According to an embodiment of the present invention, a source driver with reduced power consumption is disclosed. The source driver includes a first digital-to-analog converter, an operational amplifier, an output stage, a second digital-to-analog converter, a first switch, a second switch, and a third switch. The operational amplifier is coupled to the first digital-to-analog converter. The second digital-to-analog converter has a first output end and a second output end. The first switch is coupled between the first output end of the second digital-to-analog converter and the output stage for controlling whether to electrically couple the output stage to the first output end of the second digital-to-analog converter, the second switch is coupled between the operational amplifier and the output stage for controlling whether to electrically couple the output stage to the operational amplifier, and the third switch is coupled between the second output end of the second digital-to-analog converter and the output stage for controlling whether to electrically couple the output stage to the second output end of the second digital-to-analog converter. The first digital-to-analog converter selects a reference voltage from a plurality of reference voltages to output according to a polarity signal and a gray scale digital data. The second digital-to-analog converter selects a converter reference voltage from a plurality of converter reference voltages and outputs a first reference voltage at the first output end according to the polarity signal and the gray scale digital data. The second digital-to-analog converter selects another converter reference voltage from the plurality of converter reference voltages and outputs a second reference voltage at the second output end according to the polarity signal and the gray scale digital data.

According to an embodiment of the present invention, a source driver integrated circuit with reduced power consumption is disclosed. The source driver integrated circuit includes a timing controller and a plurality of channel groups. The timing controller is used for sequentially delaying a first reference voltage in timing to generate a plurality of first voltage signals according to a start signal and for sequentially delaying a second reference voltage in timing to generate a plurality of second voltage signals according to the start signal. Each channel group includes a first input end, a second input end, a third input end, and a plurality of source drivers. The first input end is used for receiving the corresponding first voltage signal. The second input end is used for receiving the corresponding second voltage signal. The third input end is used for receiving the start signal. Each source driver includes a digital-to-analog converter, an operational amplifier, an output stage, a first switch, a second switch, and a third switch. The operational amplifier is coupled to the digital-to-analog converter. The first switch is coupled between the operational amplifier and the output stage for controlling whether to electrically couple the output stage to the operational amplifier, the second switch is coupled between the second input end and the output stage for controlling whether to electrically couple the output stage to the second input end, and the third switch is coupled between the first input end and the output stage for controlling whether to electrically couple the output stage to the first input end.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 is a diagram illustrating a corresponding manner of the control signals and the output voltages in FIG. 6.

FIG. 11 is a diagram illustrating a corresponding manner of the control signals and the reference voltages in FIG. 9 and in FIG. 10.

FIG. 12 is a diagram illustrating another corresponding manner of the control signals and the reference voltages in FIG. 9 and in FIG. 10.

FIG. 13 is a diagram illustrating another corresponding manner of the control signals and the reference voltages in FIG. 9 and in FIG. 10.

DETAILED DESCRIPTION

Figure 1:
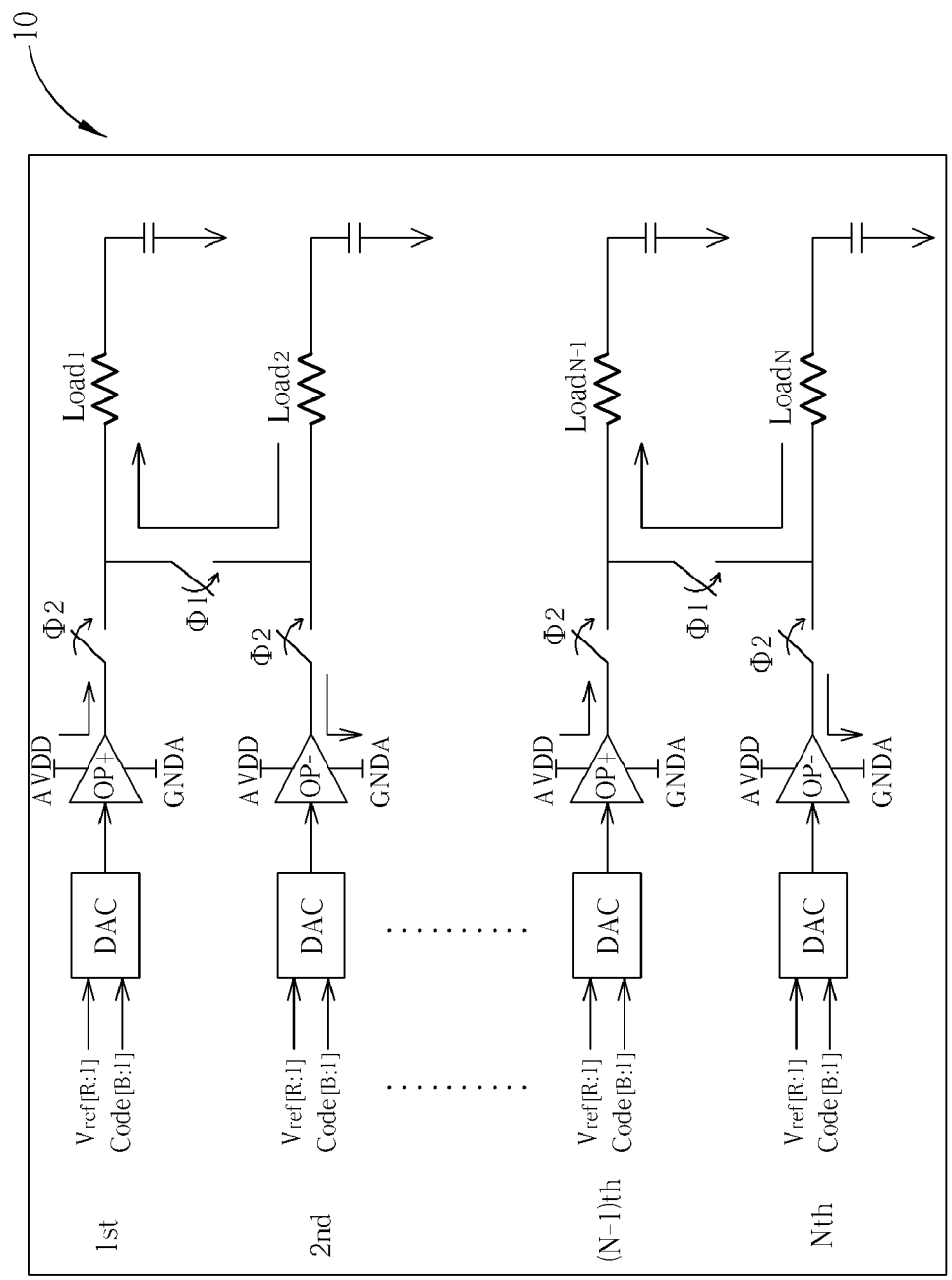
FIG. 1 is a diagram of a source driver chip utilizing charge sharing in the prior art.
Figure 2:
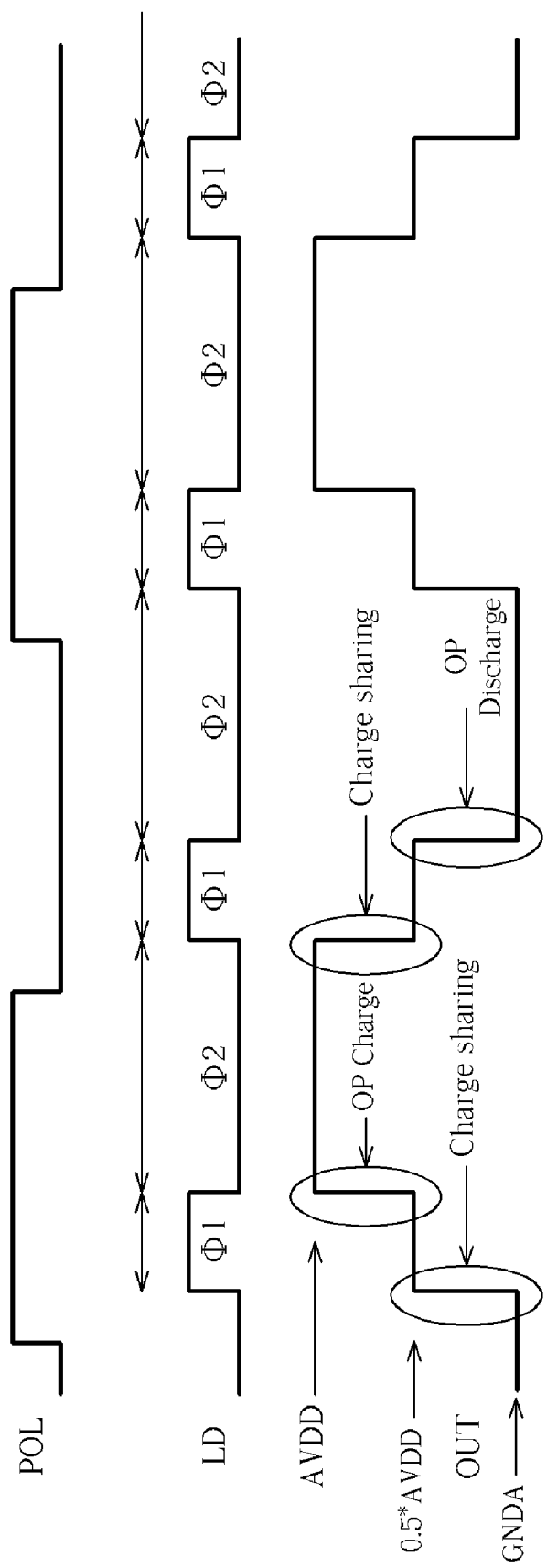
FIG. 2 is a timing diagram of the source driver in FIG. 1.
Figure 3:
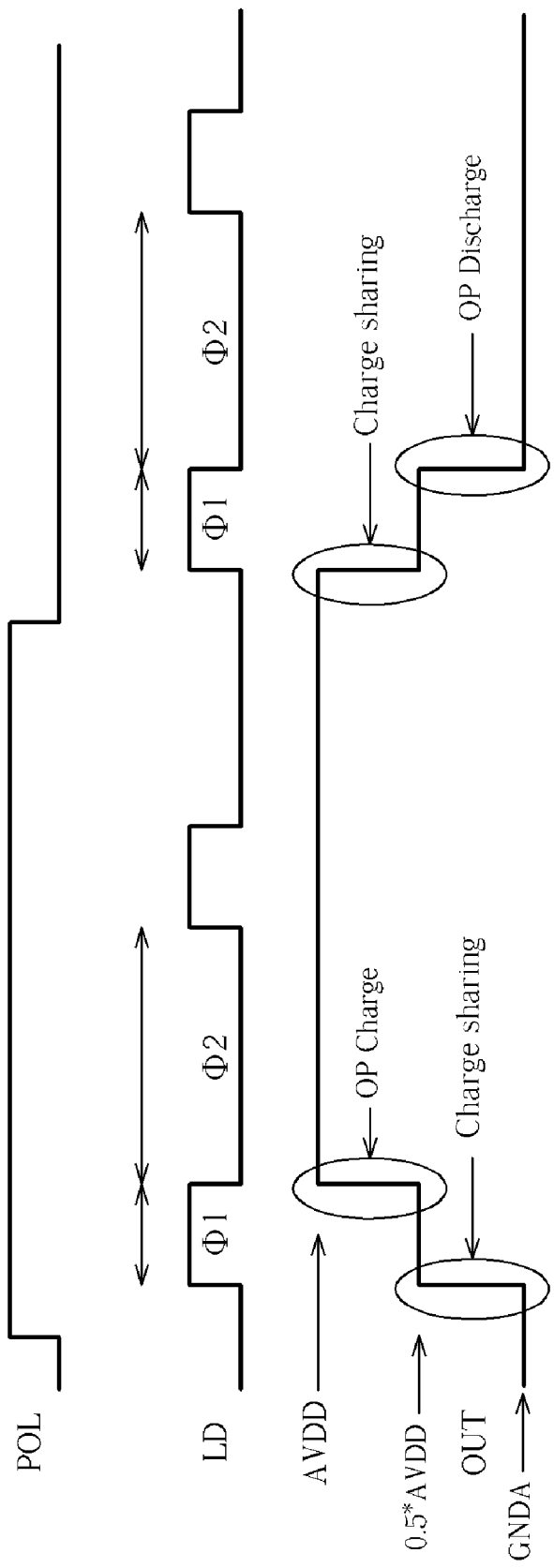
FIG. 3 is another timing diagram of the source driver in FIG. 1.
Figure 4:
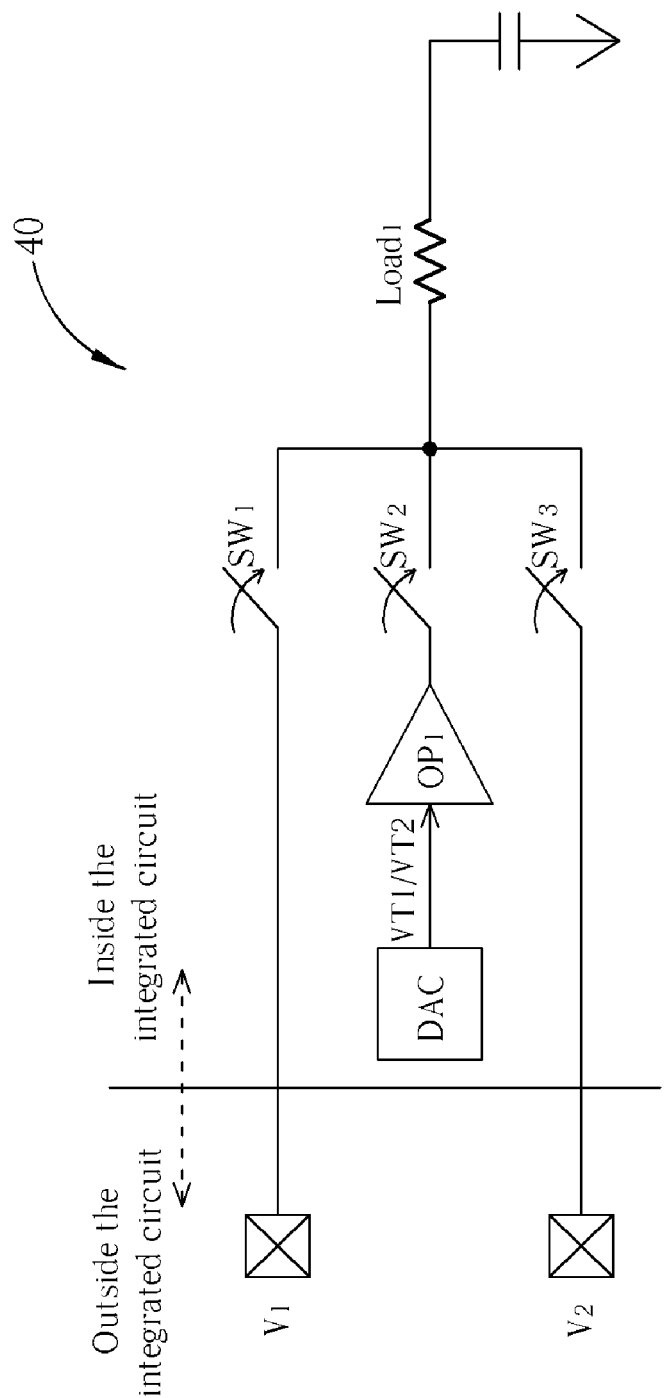
FIG. 4 is a diagram of a source driver chip according to an embodiment of the present invention.

Please refer to FIG. 4, which is a diagram of a source driver chip 40 according to an embodiment of the present invention. A first reference voltage $V_1$ and a second reference voltage $V_2$ are first generated outside of the integrated circuit, and the first reference voltage $V_1$ and the second reference voltage $V_2$ are coupled to the internal part of the integrated circuit through a first pin and a second pin of the source driver chip 40. The loading $Load_1$ outside of the integrated circuit is electrically coupled to the first reference voltage $V_1$ or the second reference voltage $V_2$ according to the polarity of the output stage of the source driver, and then the loading $Load_1$ outside of the integrated circuit is coupled to the operational amplifier $OP_1$ to be charged or discharged to a first target voltage $VT_1$ or a second target voltage $VT_2$. Assume that the first target voltage $VT_1$ is greater than the second target voltage $VT_2$. If desirable to charge the loading $Load_1$ outside of the integrated circuit to the first target voltage $VT_1$, the loading $Load_1$ outside of the integrated circuit is first coupled to the first reference voltage $V_1$. At this time, a first switch $SW_1$ is turned on. The loading $Load_1$ outside of the integrated circuit is coupled to the operational amplifier $OP_1$ to be charged to the first target voltage $VT_1$, whereof a second switch $SW_2$ is turned on at this time. Similarly, if desirable to discharge the loading $Load_1$ outside of the integrated circuit to the second target voltage $VT_2$, the loading $Load_1$ outside of the integrated circuit is first coupled to the second reference voltage $V_2$. At this time, the third switch $SW_3$ is turned on. And then the loading $Load_1$ outside of the integrated circuit is coupled to the operational amplifier $OP_1$ to be discharged to the second target voltage $VT_2$ continuously. At this time, the second switch $SW_2$ is turned on. The loading $Load_1$ outside of the integrated circuit is selected to be coupled to the first reference voltage $V_1$, the second reference voltage $V_2$, or the operational amplifier $OP_1$ through turning on or off the first switch $SW_1$, the second switch $SW_2$, and the third switch $SW_3$.

In one embodiment, the first target voltage $VT_1$ is a system supply voltage (AVDD) and the second target voltage $VT_2$ is a system ground voltage (GNDA). Thus, the first reference voltage $V_1$ close to the first target voltage $VT_1$ can be three-fourths of the system supply voltage (¾AVDD) and the second reference voltage $V_2$ close to the second target voltage $VT_2$ can be one-fourth of the system supply voltage (¼AVDD).

Figure 5:
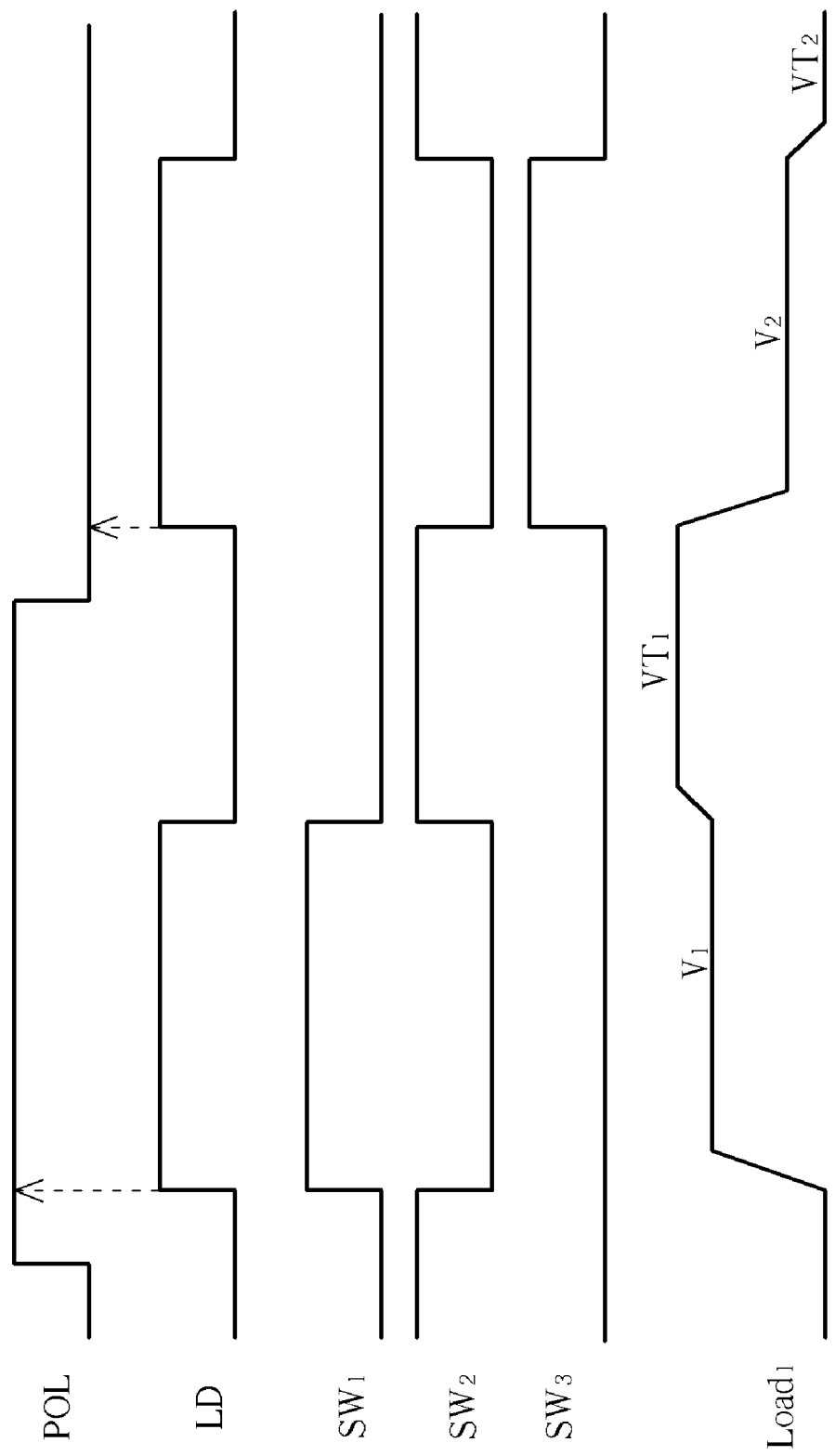
FIG. 5 is a timing diagram of the source driver in FIG. 4.

Please refer to FIG. 5. FIG. 5 is a timing diagram of the source driver in FIG. 4. On the rising edge of the start signal LD, the loading $Load_1$ outside of the integrated circuit is determined whether to be coupled to the first reference voltage $V_1$ or the second reference voltage $V_2$ according to the polarity signal POL. The loading $Load_1$ outside of the integrated circuit is coupled to the operational amplifier $OP_1$ for charging or discharging when the start signal LD is low. During the period that the first switch $SW_1$ is turned on, the loading $Load_1$ outside of the integrated circuit is raised or lowered to the first reference voltage $V_1$. During the period that the second switch $SW_2$ is turned on, the loading $Load_1$ outside of the integrated circuit is driven to the first target voltage $VT_1$ by the operational amplifier $OP_1$. The loading $Load_1$ outside of the integrated circuit is raised or lowered to the second reference voltage $V_2$ first during the period that the third switch $SW_3$ is turned on, and the loading $Load_1$ outside of the integrated circuit is driven to the second target voltage $VT_2$ by the operational amplifier $OP_1$ during the period that the second switch $SW_2$ is turned on. If the first reference voltage $V_1$ is close to the first target voltage $VT_1$ and the second reference voltage $V_2$ is close to the second target voltage $VT_2$, the operational amplifier $OP_1$ only needs to provide a few charges to drive the loading $Load_1$ outside of the integrated circuit to the target voltage, which can reduce power consumption of the source driver by a wide margin.

Figure 6:
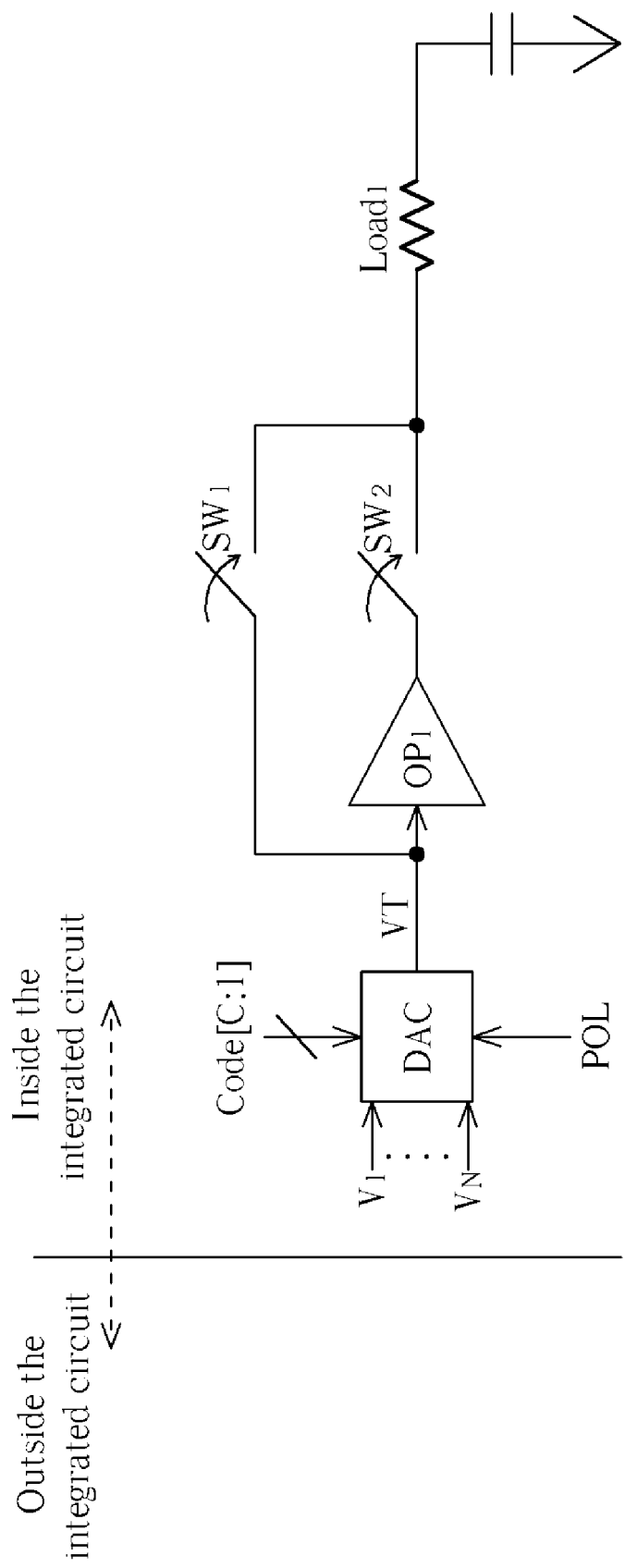
FIG. 6 is a diagram of a source driver chip according to another embodiment of the present invention.

Please refer to FIG. 6, which is a diagram of a source driver chip according to another embodiment of the present invention. A digital-to-analog converter DAC in the inside part of the integrated circuit selects one reference voltage from a plurality of reference voltages $V_1$-$V_N$ to output according to a polarity signal POL and a gray-scale digital data Code[C:1], wherein the gray-scale digital data Code[C:1] represents the gray-scale digital data desired to be displayed on flat panel displays and is generated by a timing controller and transmitted to the source driver for buffering and usage. The polarity signal POL represents output polarities and the signal VT represents the target voltage. The loading $Load_1$ outside of the integrated circuit is first electrically coupled to be charged or to be discharged to one of the above-selected reference voltages $V_1$-$V_N$, and then the loading $Load_1$ outside of the integrated circuit is coupled to the operational amplifier $OP_1$ to be charged or discharged to the target voltage VT. That is, the loading $Load_1$ outside of the integrated circuit is first coupled to the output end of the digital-to-analog converter DAC to be charged to the selected reference voltage. At this time, the first switch $SW_1$ is turned on. Then the loading $Load_1$ outside of the integrated circuit is coupled to the operational amplifier $OP_1$ to be charged to the target voltage VT, wherein the second switch $SW_2$ is turned on at this time.

Figure 8:
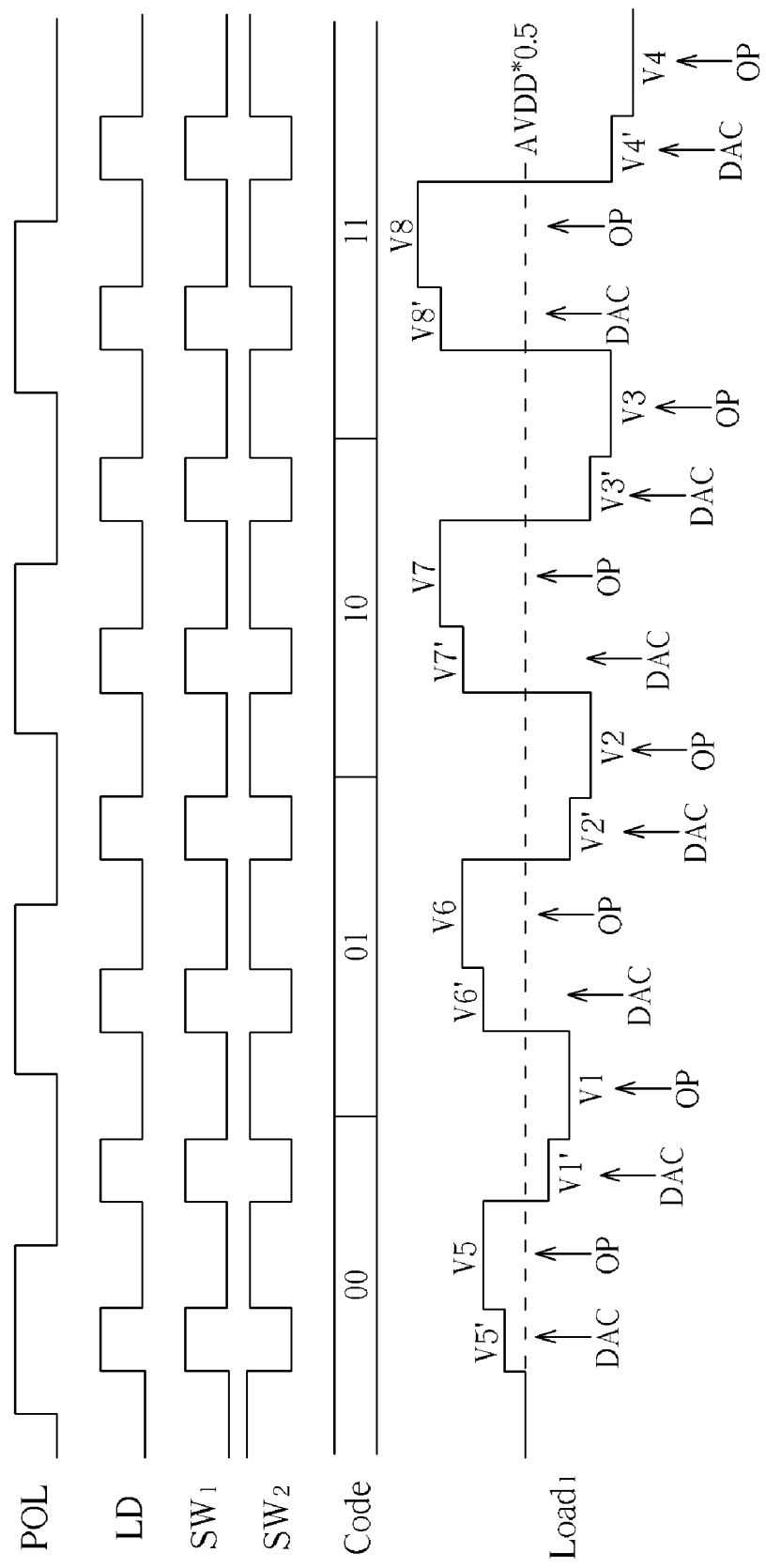
FIG. 8 is a timing diagram of the source driver in FIG. 6.

Please refer to FIG. 7, FIG. 8, and FIG. 6. FIG. 7 is a diagram illustrating a corresponding manner of the control signals and the output voltages in FIG. 6. Supposing that the gray-scale digital data Code[C:1] has a two bit Code[2:1], eight target voltages $V_1$-$V_8$ are generated according to combinations of the polarity signal POL and the Code[2:1]. $V_1'$-$V_8'$ individually represent the voltages close to the eight target voltages $V_1$-$V_8$ (please refer to FIG. 8). As shown in FIG. 7, the target voltage VT is $V_1$ when the polarity signal POL is 0 and the Code[2:1] is 00. The rest may be deduced by analogy.

Please refer to FIG. 8. FIG. 8 is a timing diagram of the source driver in FIG. 6. As shown in FIG. 8, the target voltage is corresponding to $V_5$ when the polarity signal POL is 1 and the Code[2:1] is 00. The first switch $SW_1$ is turned on to couple the loading $Load_1$ outside of the integrated circuit to the output end of the digital-to-analog converter DAC to be charged to the voltage $V_5'$, and then the second switch $SW_2$ is turned on to couple the loading $Load_1$ outside of the integrated circuit, to the operational amplifier $OP_1$ to be charged to the target voltage $V_5$. The rest may be deduced by analogy.

Figure 9:
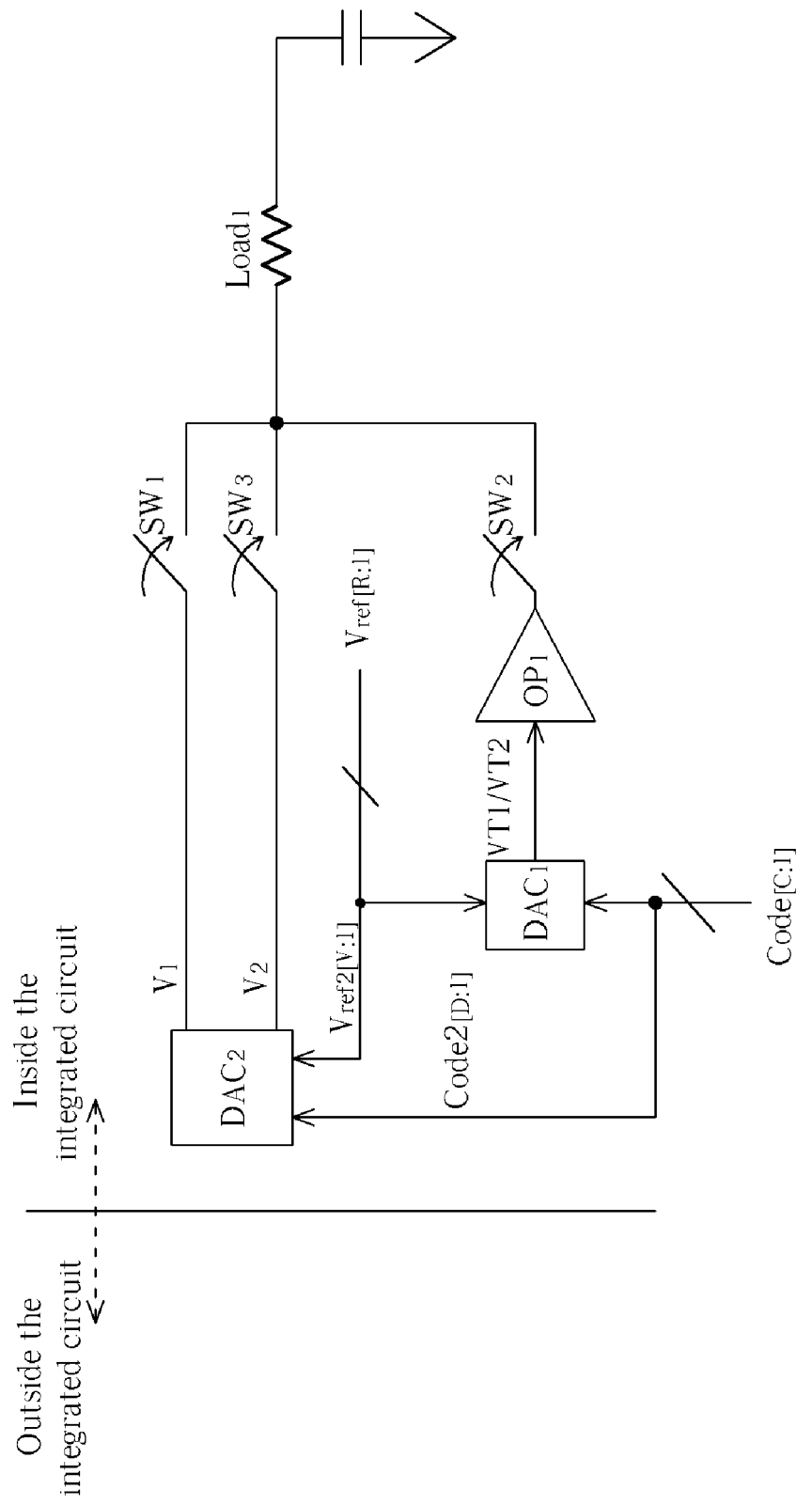
FIG. 9 is a diagram of a source driver chip according to another embodiment of the present invention.

Please refer to FIG. 9. FIG. 9 is a diagram of a source driver chip according to another embodiment of the present invention. The gray-scale digital data Code[C:1] represents the gray-scale digital data desired to be displayed on flat panel displays, Vref[R:1] represent R reference voltages, Vref2[V:1] represent V reference voltages of a partial set or a complete set of the R reference voltages Vref[R:1] (V≦R), Code2[D:1] represent D bits of a partial set or a complete set of the gray-scale digital data Code[C:1] (D≦C), and $VT_1$ and $VT_2$ represent the target voltages under the positive polarity and the negative polarity. One reference voltage is selected to output (output the first reference voltage $V_1$ or the second reference voltage $V_2$) from the plurality of reference voltages Vref2[V:1] by a second digital-to-analog converter $DAC_2$ according to the polarity signal POL and the Code2[D:1], and the loading $Load_1$ outside of the integrated circuit is coupled to the first reference voltage $V_1$ or the second reference $V_2$. After that, the loading $Load_1$ outside of the integrated circuit is coupled to the operational amplifier $OP_1$ to be charged or discharged to the target voltages $VT_1$ or $VT_2$. During the time that the first switch $SW_1$ is turned on, the voltage of the loading $Load_1$ outside of the integrated circuit is raised or lowered to the first reference voltage $V_1$. During the time that the second switch $SW_2$ is then turned on, the voltage of the loading $Load_1$ outside of the integrated circuit is charged to the first target voltage $VT_1$ by the operational amplifier $OP_1$. During the time that the third switch $SW_3$ is turned on, the voltage of the loading $Load_1$ outside of the integrated circuit is first lowered to the second reference voltage $V_2$. During the time that the second switch $SW_2$ is then turned on, the voltage of the loading $Load_1$ outside of the integrated circuit is discharged to the second target voltage $VT_2$. Due to the first reference voltage $V_1$ being close to the first target voltage $VT_1$ and the second reference voltage $V_2$ being close to the second target voltage $VT_2$, only a few charges need to be supplied by the operational amplifier $OP_1$ to drive the loading $Load_1$ outside of the integrated circuit to the target voltage. Hence, power consumption of the source driver can be lowered by a wide margin.

Figure 10:
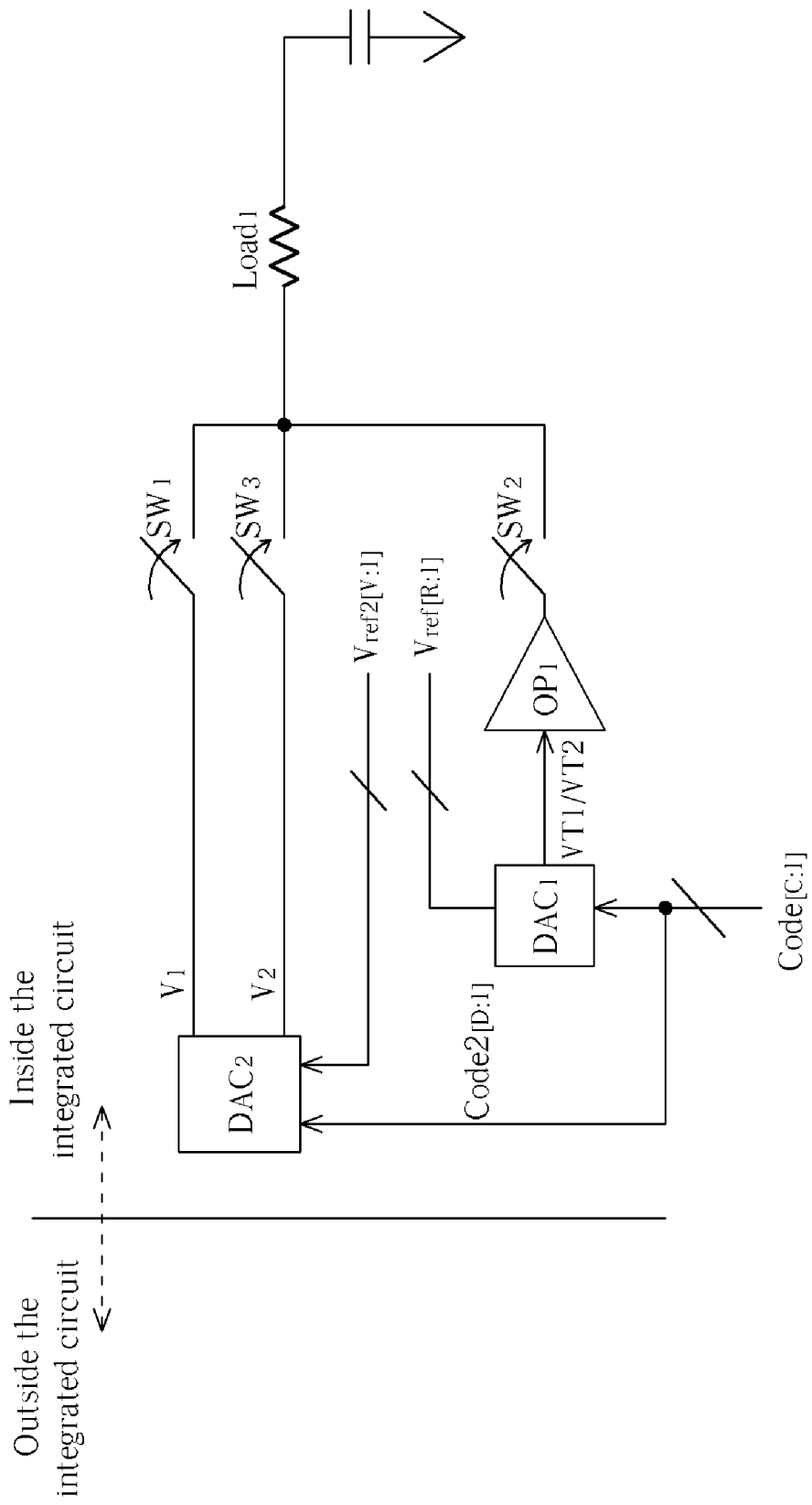
FIG. 10 is a diagram of a source driver chip according to another embodiment of the present invention.

Please refer to FIG. 10, which is a diagram of a source driver chip according to another embodiment of the present invention. The difference between FIG. 10 and FIG. 9 is that the reference voltage Vref2[V:1] utilized by the second digital-to-analog converter $DAC_2$ is independent of the reference voltage Vref[R:1] utilized by the first digital-to-analog converter $DAC_1$. The first reference voltage $V_1$ and the second reference voltage $V_2$ are still outputted from the second digital-to-analog converter $DAC_2$. The first switch $SW_1$, the second switch $SW_2$, and the third switch $SW_3$ are used for selecting whether to couple the loading $Load_1$ outside of the integrated circuit to the first reference voltage $V_1$, the second reference voltage $V_2$, or the operational amplifier $OP_1$.

Please refer to FIG. 11. FIG. 11 is a diagram illustrating a corresponding manner of the control signals and the reference voltages in FIG. 9 and in FIG. 10. Assuming that V equals 16 and D equals 3, this kind of corresponding manner represents that the Code2[3:1] with different values will select different values of the second reference voltage Vref2.

Please refer to FIG. 12. FIG. 12 is a diagram illustrating another corresponding manner of the control signals and the reference voltages in FIG. 9 and in FIG. 10. Assuming that V equals 16 and D equals 3, this kind of corresponding manner represents that the Code2[3:1] with different values can select the same values of the second reference voltage Vref2.

Please refer to FIG. 13. FIG. 13 is a diagram illustrating another corresponding manner of the control signals and the reference voltages in FIG. 9 and in FIG. 10. Assuming that V equals 16 and D equals 3, this kind of corresponding manner represents that the values of the first reference voltage $V_1$ and the second reference voltage $V_2$ are independent of the value of Code2[3:1] and can be fixed at specific values of the second reference voltage Vref2, whereof Vref2[1] and Vref2[16] represent the specific values of the second reference voltage Vref2.

Figure 14:
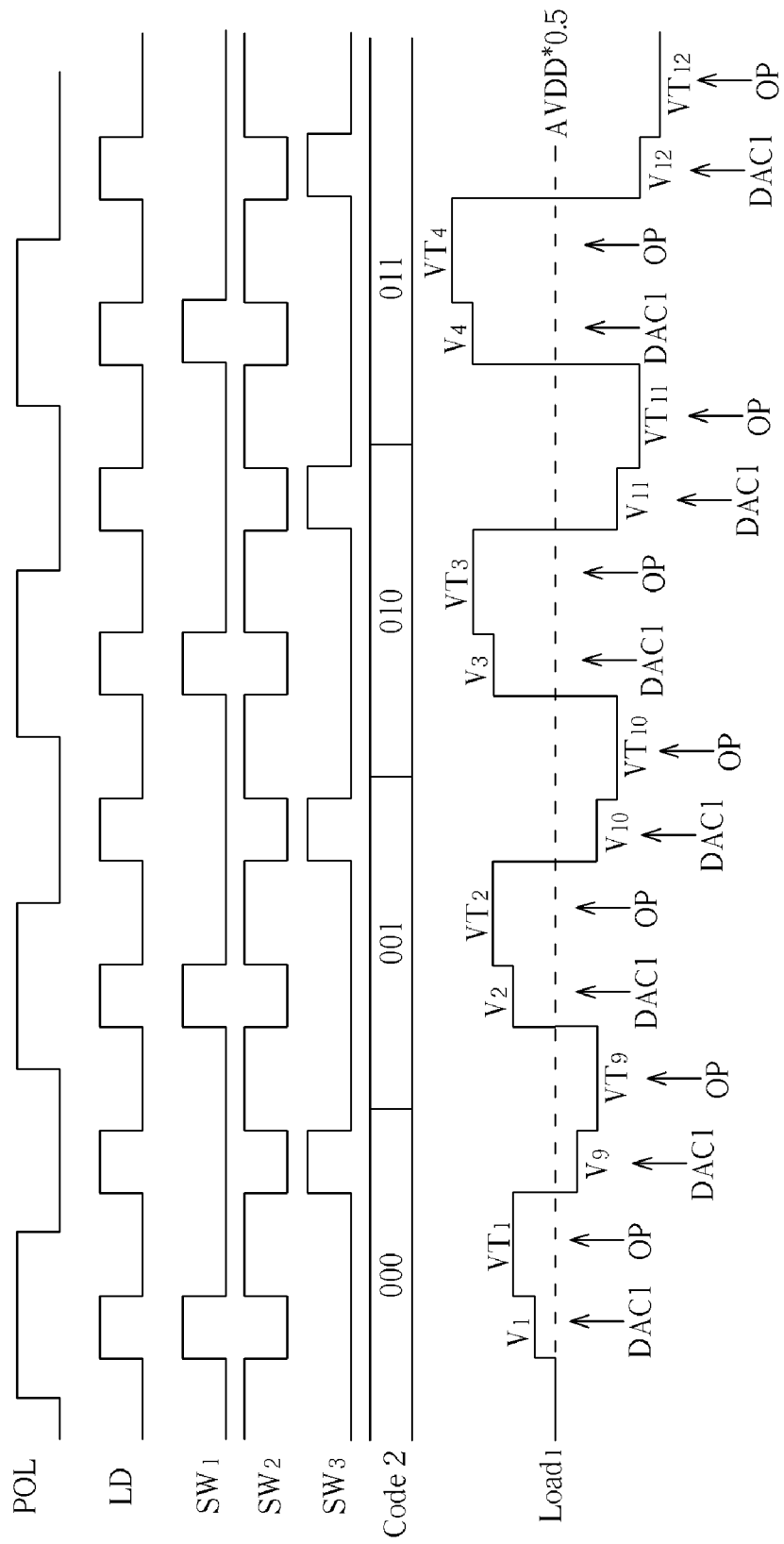
FIG. 14 is a timing diagram of the source driver in FIG. 9 and in FIG. 10.

Please refer to FIG. 14. FIG. 14 is a timing diagram of the source driver in FIG. 9 and in FIG. 10. In this embodiment, the corresponding manner of the control signals and the reference voltages adopts the corresponding manner shown in FIG. 11. Take Code2[3:1] of 000, 001, 010, and 011 for example, $VT_1$-$VT_4$ individually represent the target voltages when the Code2[3:1] is 000-011 having the positive polarity and $VT_9$-$VT_{12}$ individually represent the target voltages when the Code2[3:1] is 000-011 having the negative polarity. When the first switch $SW_1$ is turned on, the loading $Load_1$ outside of the integrated circuit is first raised to the reference voltage $V_1$. When the second switch $SW_2$ is turned on, the loading $Load_1$ outside of the integrated circuit is driven to the target voltage $VT_1$ by the operational amplifier $OP_1$. During the time that the third switch $SW_3$ is turned on, the loading $Load_1$ outside of the integrated circuit is lowered to the reference voltage $V_9$. During the time that the second switch $SW_2$ is then turned on, the loading $Load_1$ outside of the integrated circuit is driven to the target voltage $VT_9$ by the operational amplifier $OP_1$. The rest may be deduced by analogy.

Figure 15:
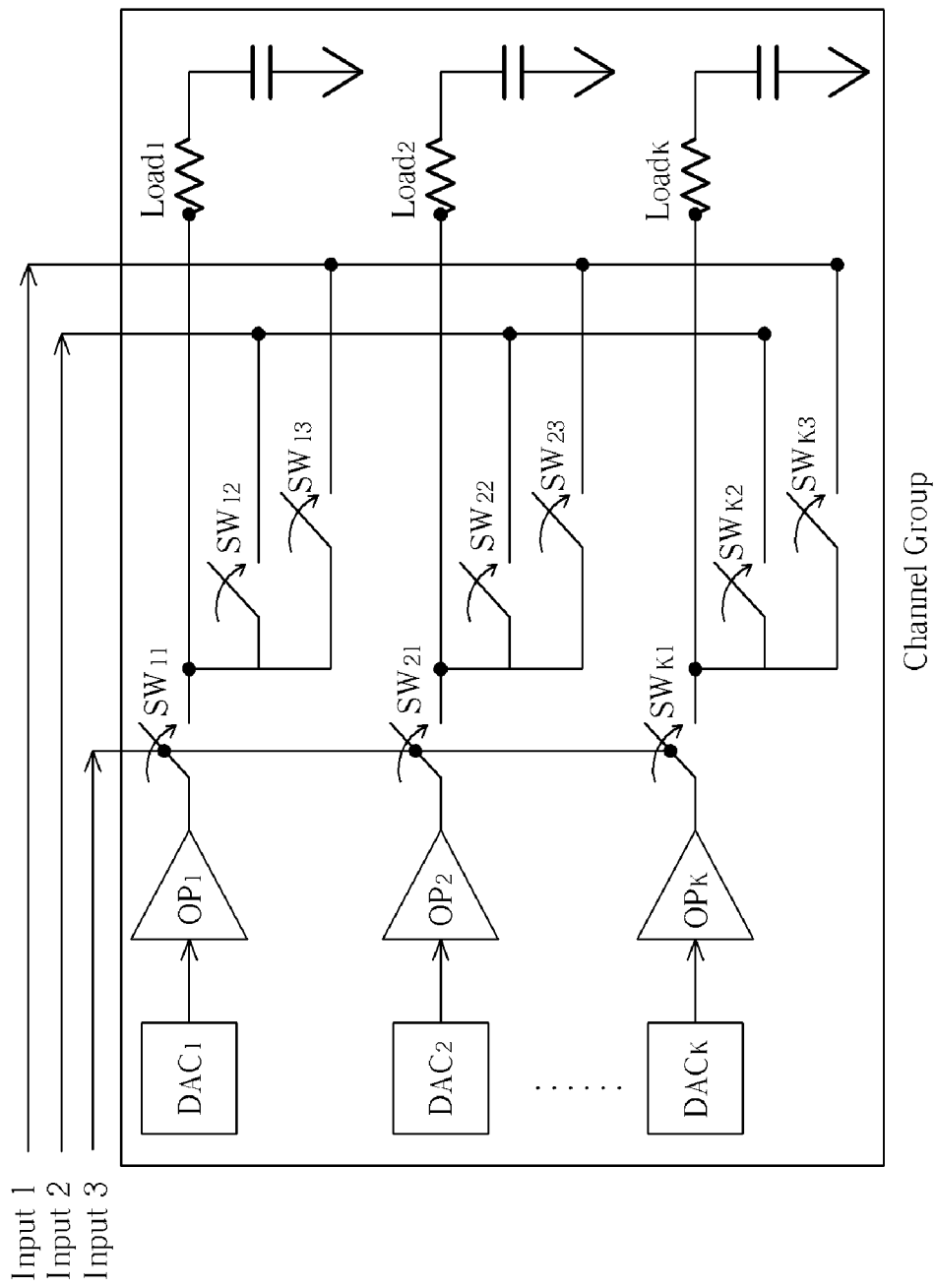
FIG. 15 is a diagram illustrating a channel group inside a source driver chip according to an embodiment of the present invention.

Please refer to FIG. 15, which is a diagram illustrating a channel group inside a source driver chip according to an embodiment of the present invention. Assume that a total amount of the channels inside the source driver chip is N and the N channels are divided into M channel groups, wherein each channel group includes a first input end Input1, a second input end Input2, and a third input end Input3. Each first input end Input1 is used for receiving corresponding first voltage signals $P_1$-$P_M$, each second input end Input2 is used for receiving corresponding second voltage signals $N_1$-$N_M$, and each third input end Input3 is used for receiving the start signal LD (please refer to FIG. 16). Each channel group includes K source drivers, wherein each source driver includes a digital-to-analog converter $DAC_1$-$DAC_K$, an operational amplifier $OP_1$-$OP_K$, a first switch $SW_{11}$-$SW_{K1}$, a second switch $SW_{12}$-$SW_{K2}$, and a third switch $SW_{13}$-$SW_{K3}$. The first switches $SW_{11}$-$SW_{K1}$ are individually coupled between the loadings $Load_1$-$Load_K$ outside the source driver and the operational amplifiers $OP_1$-$OP_K$ and are controlled to turn on or off according to the start signal LD received by the third input ends Input3. The first switches $SW_{11}$-$SW_{K1}$ are used for determining whether the operational amplifiers $OP_1$-$OP_K$ can charge or discharge the corresponding loadings $Load_1$-$Load_K$. The second switches $SW_{12}$-$SW_{K2}$ are individually coupled between the loadings $Load_1$-$Load_K$ outside the source driver and the corresponding second input ends Input2 and are used for determining whether to couple the second voltage signals $N_1$-$N_M$ received at the second input ends Input2 to the corresponding loadings $Load_1$-$Load_K$. The third switches $SW_{13}$-$SW_{K3}$ are individually coupled between the loadings $Load_1$-$Load_K$ outside the source driver and the corresponding first input ends Input1 and are used for determining whether to couple the first voltage signals $P_1$-$P_M$ received at the first input ends Input1 to the corresponding loadings $Load_1$-$Load_K$.

Figure 16:
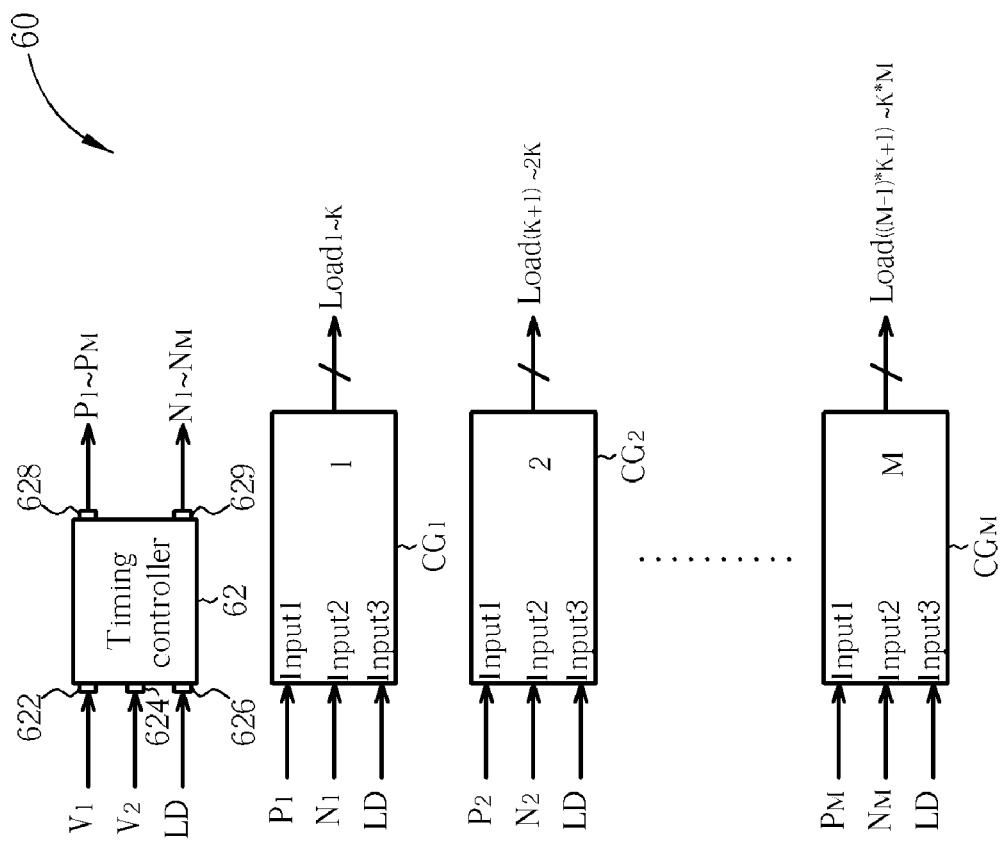
FIG. 16 is a diagram of a source driver chip according to an embodiment of the present invention.
Figure 17:
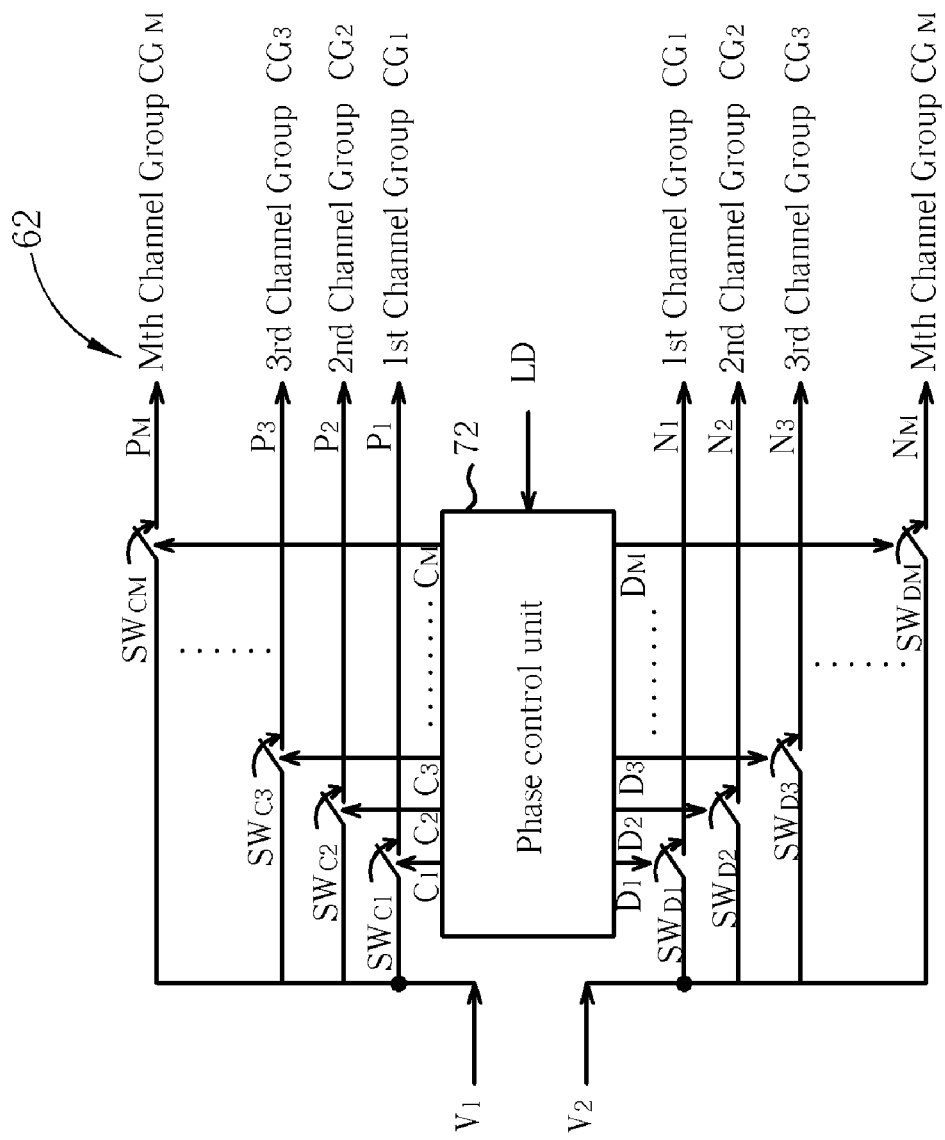
FIG. 17 is a diagram illustrating the architecture of the timing controller in FIG. 16.

Please refer to FIG. 16 and FIG. 17. FIG. 16 is a diagram of a source driver chip 60 according to an embodiment of the present invention. The source driver chip 60 includes a timing controller 62 and M channel groups $CG_1$-$CG_M$, wherein each channel group $CG_1$-$CG_M$ includes K source drivers. Thus the source driver chip 60 totally includes M×K source drivers and M×K loadings $Load_1$-$Load_{M\times K}$ outside the source driver chip. The timing controller 62 includes a first input end 622 used for receiving a first reference voltage $V_1$, a second input end 624 used for receiving a second reference voltage $V_2$, a control end 626 used for receiving a start signal LD, M first output ends 628 used for sequentially delaying the first reference voltage $V_1$ in timing to generate M first voltage signals $P_1$-$P_M$ according to the start signal LD, and M second output ends 629 used for sequentially delaying the second reference voltage $V_2$ in timing to generate M second voltage signals $N_1$-$N_M$ according to the start signal LD. Each channel group $CG_1$-$CG_M$ includes a first input end Input1, a second input end Input2, and a third input end Input3 individually used for receiving the corresponding first voltage signals $P_1$-$P_M$, the corresponding second voltage signals $N_1$-$N_M$, and the start signal LD.

Please refer to FIG. 17 and FIG. 16. FIG. 17 is a diagram illustrating the architecture of the timing controller 62 in FIG. 16. The timing controller 62 includes a phase control unit 72, M first voltage control switches $SW_{C1}$-$SW_{CM}$, and M second voltage switches $SW_{D1}$-$SW_{DM}$. The phase control unit 72 includes an input end, a plurality of first phase control signal output ends, and a plurality of second phase control signal output ends. The input end is used for receiving the start signal LD. The plurality of first phase control signal output ends are used for outputting a plurality of first phase control signals $C_1$-$C_M$ according to the start signal LD, wherein each first phase control signals $C_1$-$C_M$ is used for controlling turning on or off the corresponding first voltage control switches $SW_{C1}$-$SW_{CM}$. The plurality of second phase control signal output ends are used for outputting a plurality of second phase control signals $D_1$-$D_M$ according to the start signal LD, wherein each second phase control signals $D_1$-$D_M$ is used for controlling turning on or off the corresponding second voltage control switches $SW_{D1}$-$SW_{DM}$. Each of the plurality of first voltage control switches $SW_{C1}$-$SW_{CM}$ is coupled between the first input end 622 and the corresponding first output end 628 (coupled between the first reference voltage $V_1$ and the first voltage signal $P_1$-$P_M$), and each of the plurality of second voltage control switches $SW_{D1}$-$SW_{DM}$ is coupled between the second input end 624 and the corresponding second output end 629 (coupled between the second reference voltage $V_2$ and the second voltage signal $N_1$-$N_M$).

Figure 18:
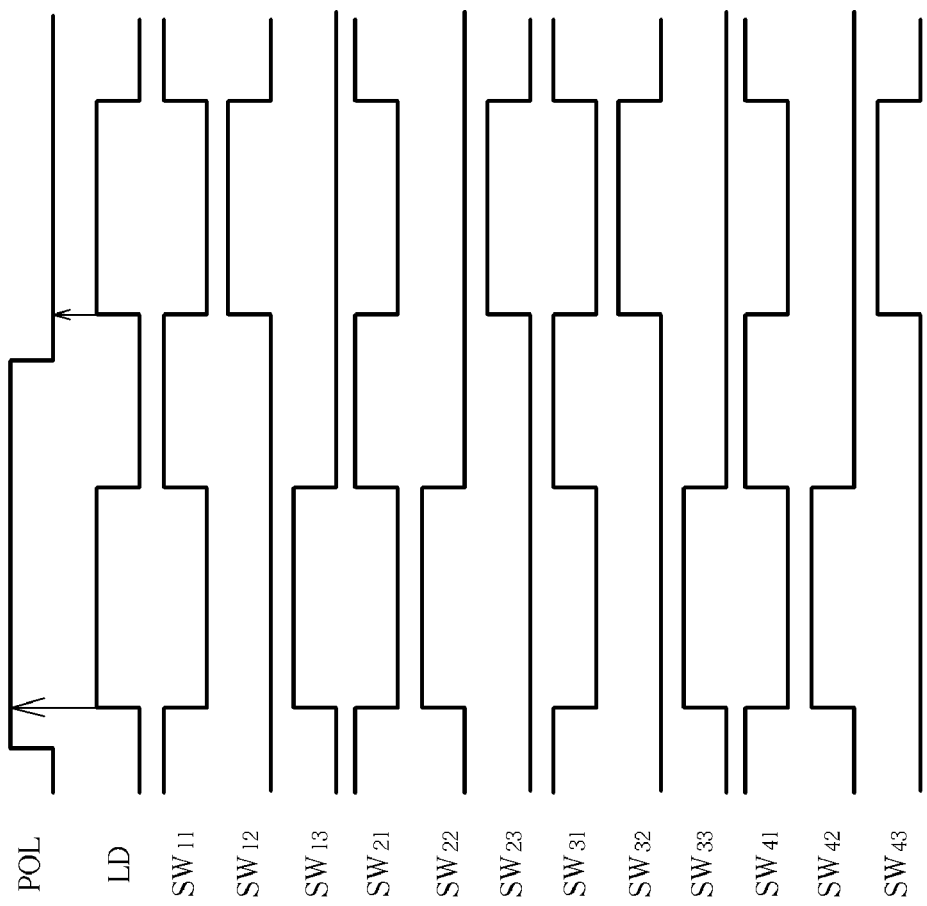
FIG. 18 is a timing diagram of the source driver in FIG. 15.

Please refer to FIG. 18, which is a timing diagram of the source driver in FIG. 15. Assume that the channel group $CG_1$ includes four source drivers and is one-line dot inversion. Adjacent operational amplifiers have opposite polarities due to it being dot inversion. Hence, the voltage control switches $SW_{13}$, $SW_{22}$, $SW_{22}$, $SW_{33}$, and $SW_{42}$ are turned on simultaneously when the polarity signal POL is 1, and the voltage control switches $SW_{12}$, $SW_{23}$, $SW_{32}$, and $SW_{43}$ are turned on simultaneously when the polarity signal POL is 0. The rest may be deduced by analogy. The voltage control switches $SW_{11}$, $SW_{21}$, $S_{31}$, and $SW_{41}$ are turned on simultaneously when the start signal LD is 0 (at this time, the loadings $Load_1$-$Load_4$ are coupled to the operational amplifiers $OP_1$-$OP_4$ respectively).

Figure 19:
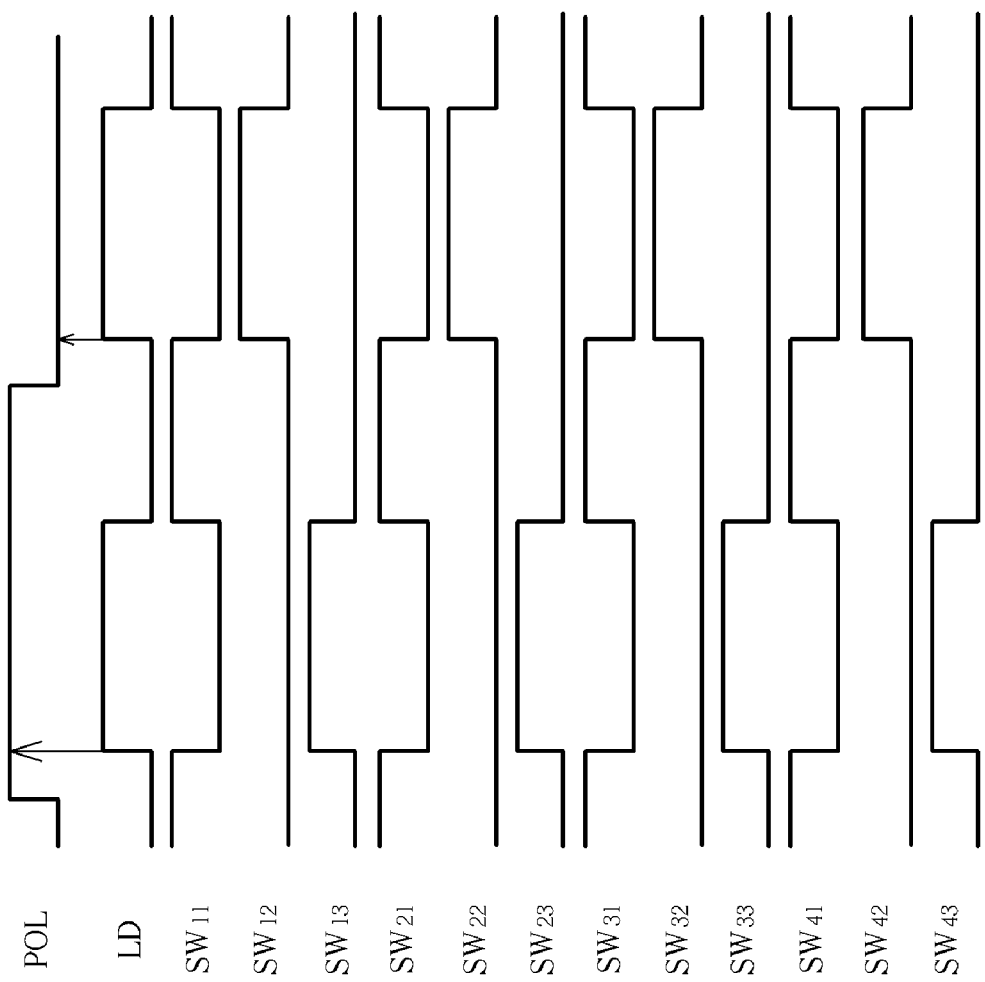
FIG. 19 is another timing diagram of the source driver in FIG. 15.

Please refer to FIG. 19, which is another timing diagram of the source driver in FIG. 15. Assume that the channel group $CG_1$ includes four source drivers and is one-line row inversion. Adjacent operational amplifiers have the same polarity due to it being row inversion. Hence, the voltage control switches $SW_{13}$, $SW_{23}$, $SW_{33}$ and $SW_{34}$ are turned on simultaneously when the polarity signal POL is 1, and the voltage control switches $SW_{12}$, $SW_{22}$, $SW_{32}$, and $SW_{42}$ are turned on simultaneously when the polarity signal POL is 0. The rest may be deduced by analogy. The voltage control switches $SW_{11}$, $SW_{21}$, $SW_{31}$, and $SW_{41}$ are turned on simultaneously when the start signal LD is 0 (at this time, the loadings $Load_1$-$Load_4$ are coupled to the operational amplifiers $OP_1$-$OP_4$ respectively).

Figure 20:
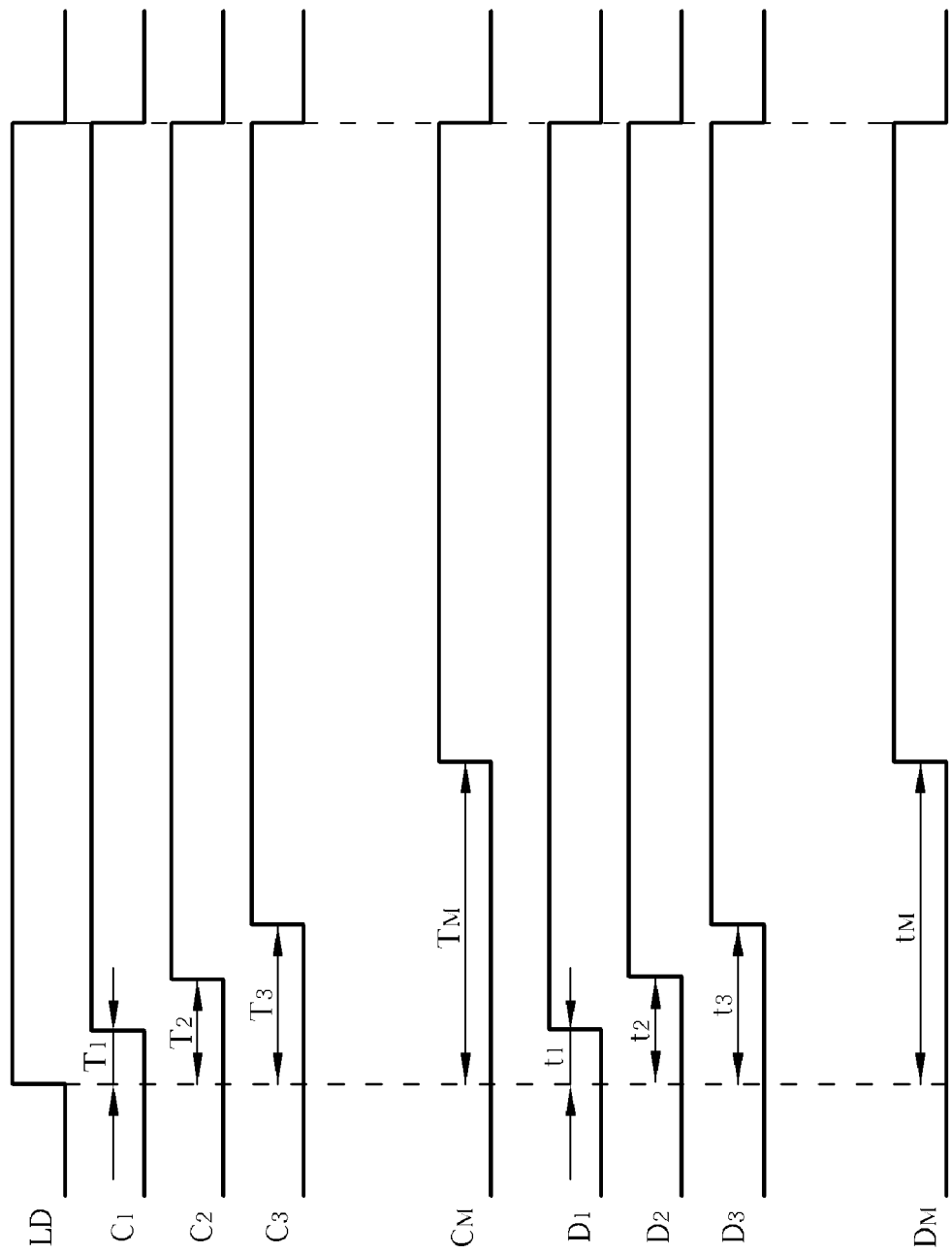
FIG. 20 is a timing diagram of the timing controller in FIG. 17.

Please refer to FIG. 20, which is a timing diagram of the timing controller in FIG. 17. $T_1$-$T_M$ represent durations of the rising edge of the first phase control signals $C_1$-$C_M$ apart from the rising edge of the start signal LD and $t_1$-$t_M$ represent durations of the rising edge of the second phase control signals $D_1$-$D_M$ apart from the rising edge of the start signal LD, wherein $T_1$-$T_M$ and $t_1$-$t_M$ are independent real numbers. The first control signals $C_1$-$C_M$ and the second control signals $D_1$-$D_M$ sequentially rise up after the start signal LD rises up and fall down simultaneously at the falling edge of the start signal LD. When the first phase control signals $C_1$-$C_M$ are high, the first voltage control switches $SW_{C1}$-$SW_{CM}$ are turned on. When the second phase control signals $D_1$-$D_M$ are high, the second voltage control switches $SW_{D1}$-$SW_{DM}$ are turned on.

Figure 21:
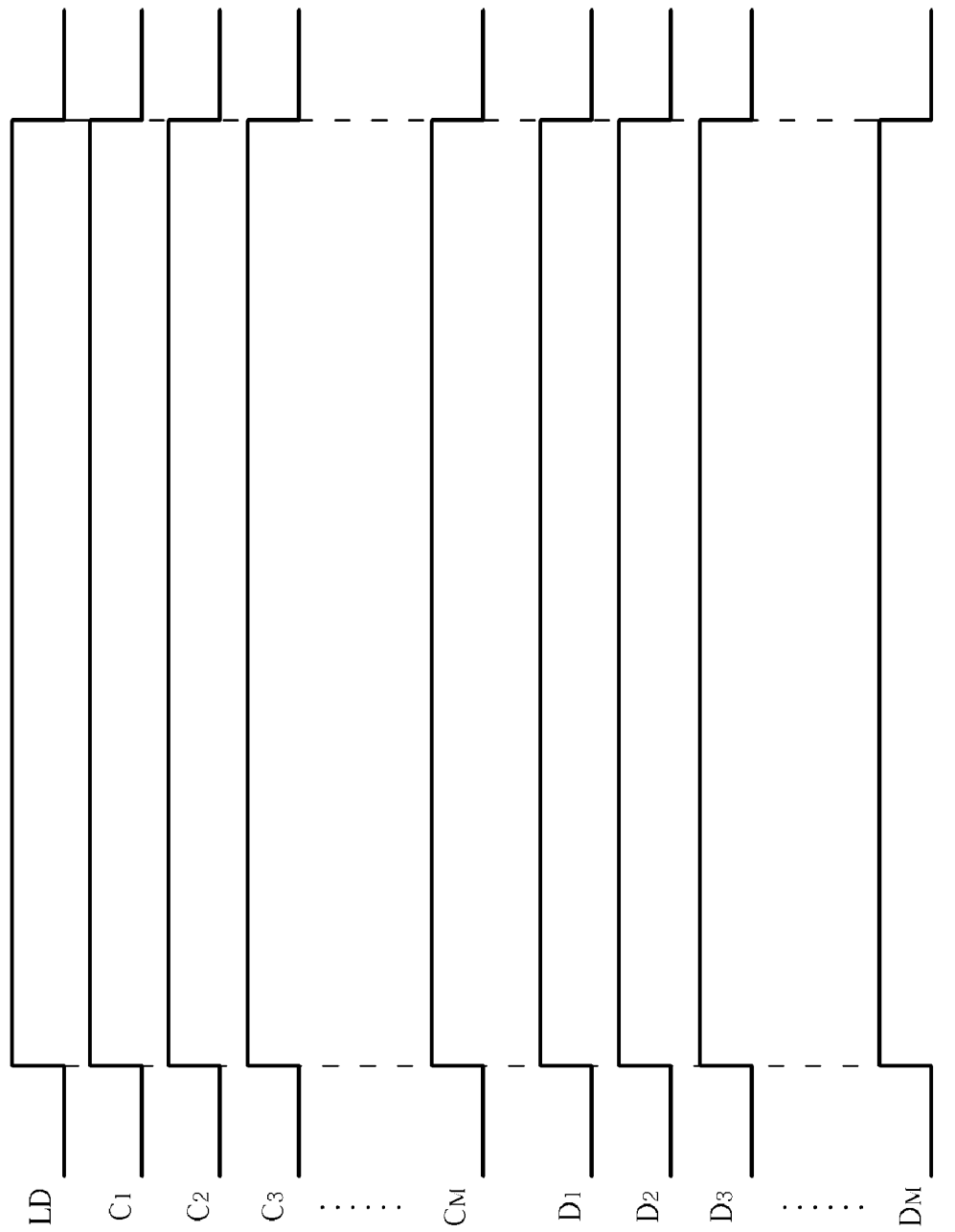
FIG. 21 is another timing diagram of the timing controller in FIG. 17.

Please refer to FIG. 21, which is another timing diagram of the timing controller in FIG. 17. At this time, all the durations $T_1$-$T_M$ and $t_1$-$t_M$ equal 0, thus the timing relationships of the first phase control signals $C_1$-$C_M$ and the second phase control signals $D_1$-$D_M$ are as shown in FIG. 21. When the first phase control signals $C_1$-$C_M$ are high, the first voltage control switches $SW_{C1}$-$SW_{CM}$ are turned on. When the second phase control signals $D_1$-$D_M$ are high, the second voltage control switches $SW_{D1}$-$SW_{DM}$ are turned on.

Figure 22:
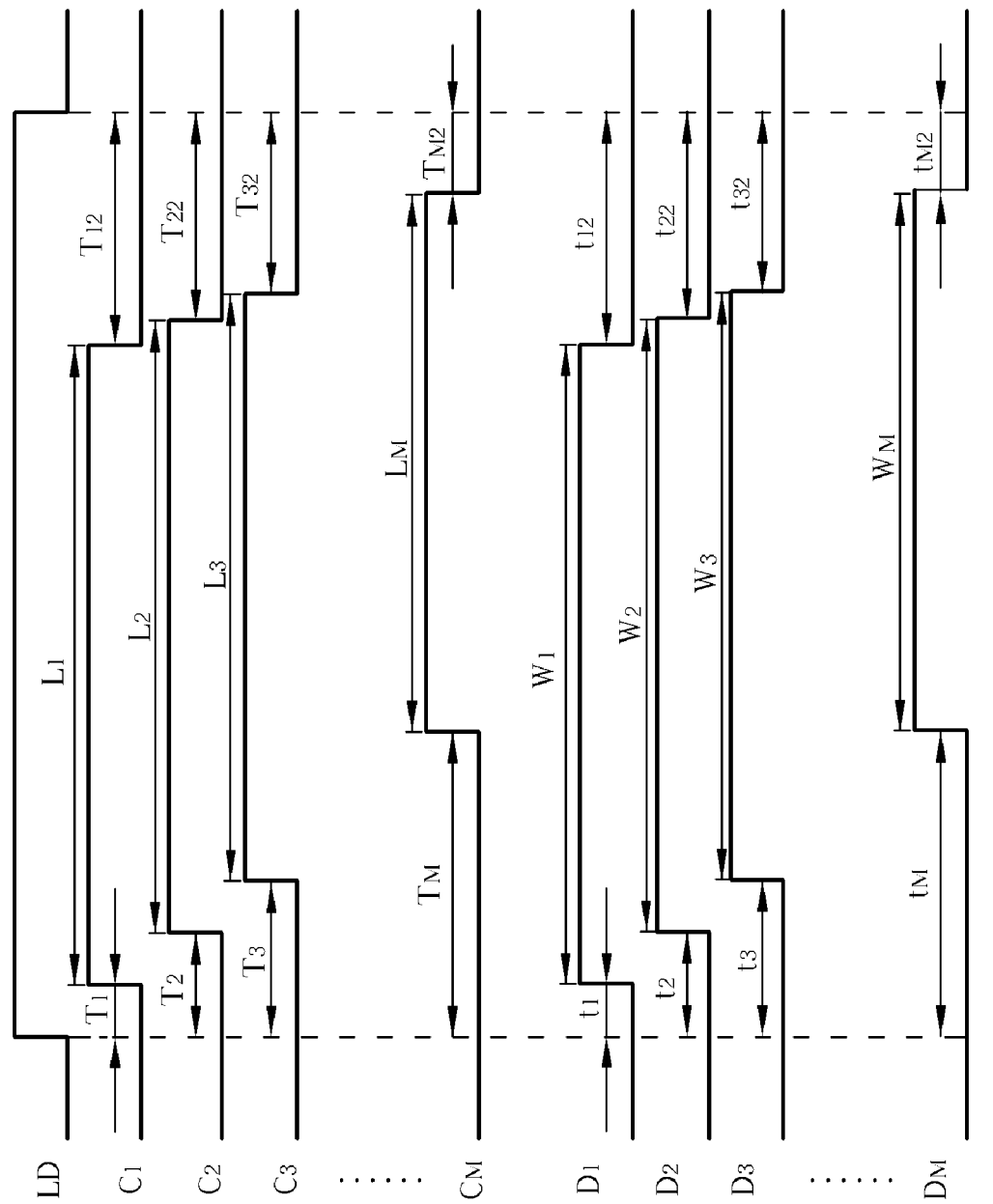
FIG. 22 is another timing diagram of the timing controller in FIG. 17.

Please refer to FIG. 22, which is another timing diagram of the timing controller in FIG. 17. $T_1$-$T_M$ represent durations of the rising edge of the first phase control signals $C_1$-$C_M$ apart from the rising edge of the start signal LD, $T_{12}$-$T_{M2}$ represent durations of the falling edge of the first phase control signals $C_1$-$C_M$ apart from the falling edge of the start signal LD, $t_1$-$t_M$ represent durations of the rising edge of the second phase control signals $D_1$-$D_M$ apart from the rising edge of the start signal LD, and $t_{12}$-$t_{M2}$ represent durations of the falling edge of the second phase control signals $D_1$-$D_M$ apart from the falling edge of the start signal LD, wherein $T_1$-$T_M$, $T_{12}$-$T_{M2}$, $t_1$-$t_M$, and $t_{12}$-$t_{M2}$ are independent real numbers. Through this kind of timing relationship, the width of first phase control signals $C_1$-$C_M$ can be adjusted the same as the width of the second phase control signals $D_1$-$D_M$ (that is $L_1$-$L_M$ have the same length and $W_1$-$W_M$ have the same length). When the first phase control signals $C_1$-$C_M$ are high, the first voltage control switches $SW_{C1}$-$SW_{CM}$ are turned on. When the second phase control signals $D_1$-$D_M$ are high, the second voltage control switches $SW_{D1}$-$SW_{DM}$ are turned on.

Figure 23:
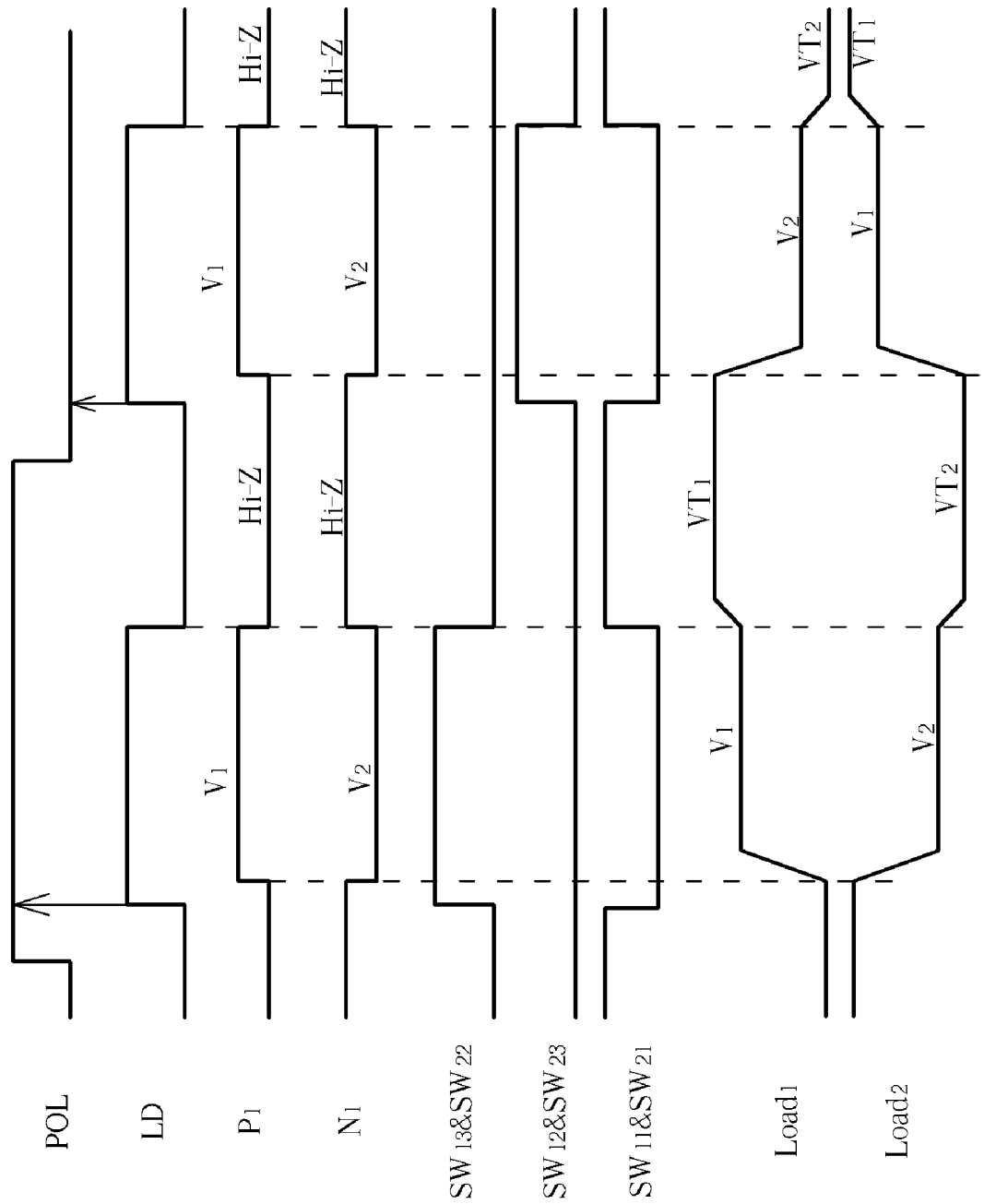
FIG. 23 is a timing diagram of the first channel and the second channel of the same channel group in FIG. 16.

Please refer to FIG. 23. FIG. 23 is a timing diagram of the first channel and the second channel of the same channel group in FIG. 16. Assume it is one-line dot inversion, thus the first channel and the second channel have opposite polarities Symbols $VT_1$ and $VT_2$ individually represent different target voltages. The first voltage signal $P_1$ is transferred from high impedance (Hi-z) to $V_1$ after the first time the start signal LD rises up. At this time, the voltage control switch $SW_{13}$ is turned on and the loading $Load_1$ outside of the integrated circuit is charged to $V_1$. After the start signal LD falls down, the voltage control switch $SW_{13}$ is turned off. At this tine, the operational amplifier $OP_1$ will continue to charge the loading $Load_1$ outside of the integrated circuit to the target voltage $VT_1$ (the voltage control switch $SW_{11}$ is turned on). At the second time the start signal LD rises up, the voltage control Switch $SW_{12}$ is turned on and the loading $Load_1$ outside of the integrated circuit is discharged to $V_2$. After the start signal LD falls down, the voltage control switch $SW_{12}$ is turned off. At this time, the operational amplifier $OP_1$ will continue to discharge the loading $Load_1$ outside of the integrated circuit to the target voltage $VT_2$ (the voltage control switch $SW_{11}$ is turned on). Due to the first channel and the second channel having opposite polarities, the second voltage signal $N_1$ is transferred from high impedance (Hi-z) to $V_2$ after the first tire the start signal LD rises up. At this time, the voltage control switch $SW_{22}$ is turned on and the loading $Load_2$ is discharged to $V_2$. After the start signal LD falls down the voltage control switch $SW_{22}$ is turned off. At this time, the operational amplifier $OP_2$ will continue to discharge the loading $Load_2$ to the target voltage $VT_2$ (the voltage control switch $SW_{21}$ is turned on). At the second tame the start signal LD rises up, the voltage control switch $SW_{23}$ is turned on and the loading $Load_2$ is charged to $V_1$. After the start signal LD falls down, the voltage control switch $SW_{23}$ is turned off. At this time, the operational amplifier $OP_2$ will continue to charge the loading $Load_2$ to the target voltage $VT_1$ (the voltage control switch $SW_{21}$ is turned on).

Figure 24:
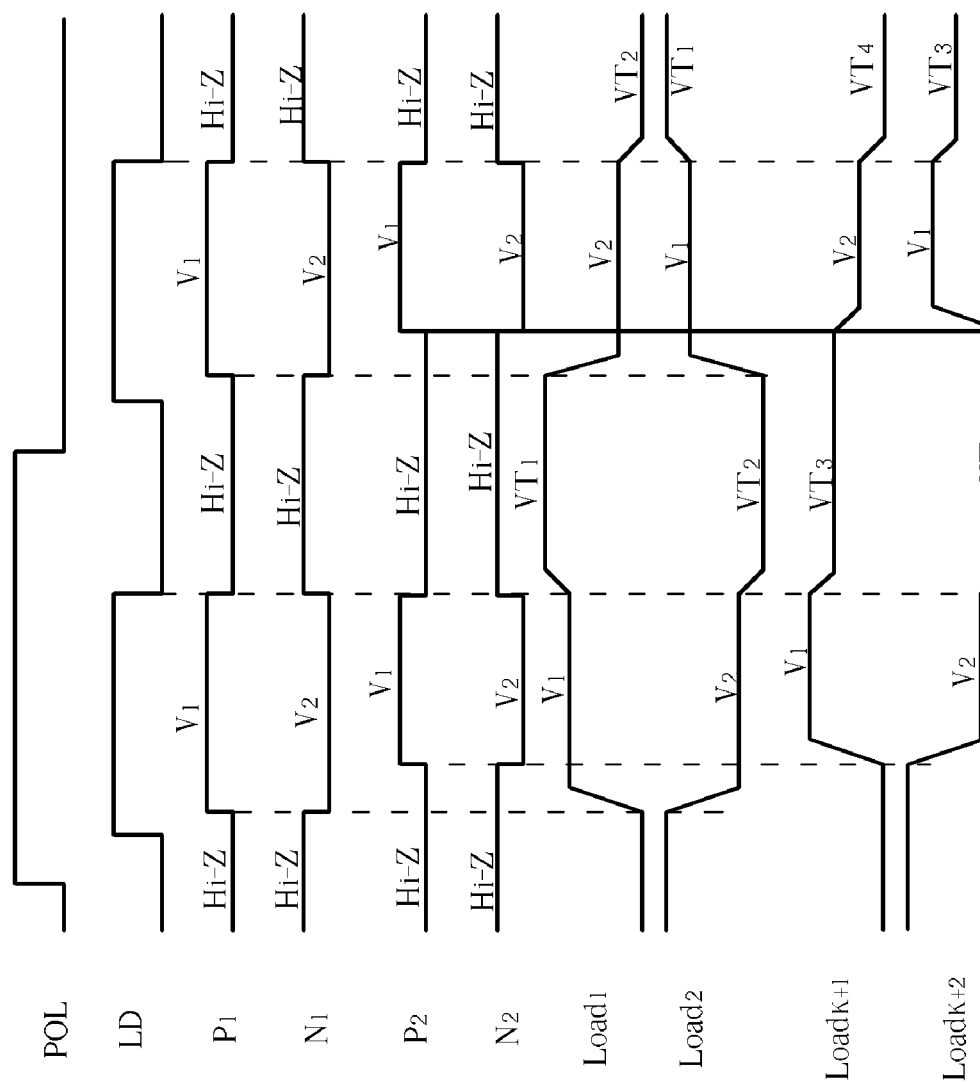
FIG. 24 is a timing diagram of the first channel group and the second channel group in FIG. 16.

Please refer to FIG. 24. FIG. 24 is a timing diagram of the first channel group and the second channel group in FIG. 16. Symbols $VT_1$, $VT_2$, $VT_3$, and $VT_4$ individually represent different target voltages. The time points when the first voltage signals $P_1$ and $P_2$ are transferred from high impedance (Hi-z) to $V_1$ and the time points when the second voltage signals $N_1$ and $N_2$ are transferred from high impedance (Hi-z) to $V_2$ can be staggered, which can prevent from charging or discharging all loadings at the same time. Therefore, transient maximum current can be avoided and system noise can be lowered.

Figure 25:
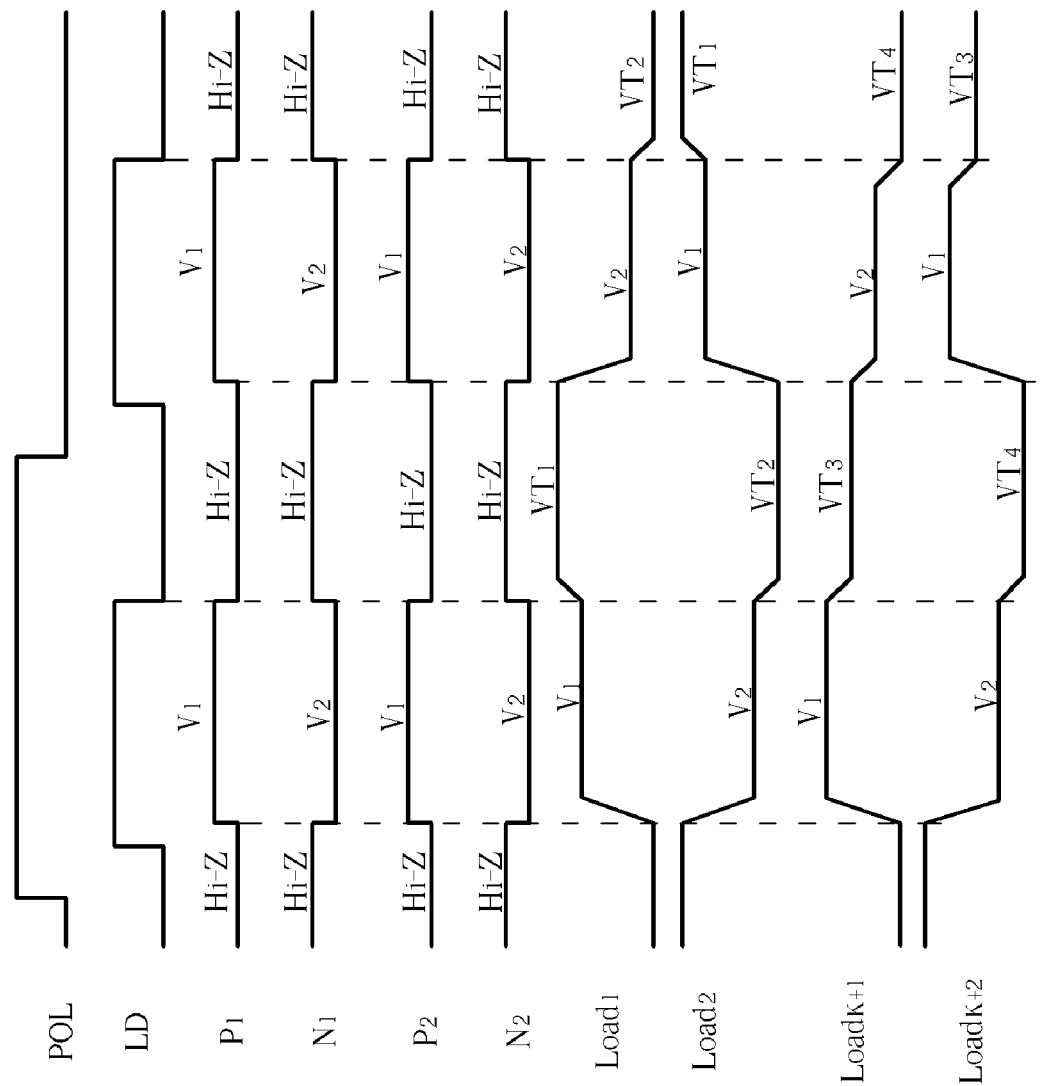
FIG. 25 is another timing diagram of the first channel group and the second channel group in FIG. 16.

Please refer to FIG. 25. FIG. 25 is another timing diagram of the first channel group and the second channel group in FIG. 16. The difference between FIG. 25 and FIG. 24 is that the time points when the first voltage signals $P_1$ and $P_2$ are transferred from high impedance (Hi-z) to $V_1$ and the time points when the second voltage signals $N_1$ and $N_2$ are transferred from high impedance (Hi-z) to $V_2$ can be adjusted to the same in FIG. 25.

The above mentioned embodiments are presented merely for describing the present disclosure, and in no way should be considered to be limitations of the scope of the present disclosure. The above mentioned reference voltages $V_1$-$V_N$ are not limited to a fixed voltage, and can be adjusted depending on user's demands. Besides, the generation manner of the reference voltages $V_1$-$V_N$ can be provided from the pins outside the chip or the digital-to-analog converters inside the chip, and is not restricted to this only. Through utilizing a timing controller, the above mentioned reference voltages can be converted to generate a plurality of voltage signals that are independent in timing. The timing relationship between the voltage signals can be all kinds of variations and combinations, and is not limited to the embodiments of the present invention. Furthermore, the elements such as the first switches $SW_1$ and $SW_{11}$-$SW_{K1}$, the second switches $SW_2$ and $SW_{12}$-$SW_{K2}$, the third switches $SW_3$ and $SW_{13}$-$SW_{K3}$, the first voltage control switches $SW_{C1}$-$SW_{CM}$, and the second voltage control switches $SW_{D1}$-$SW_{DM}$ are not restricted to metal-oxide semiconductor transistors (MOS) and bipolar junction transistors (BJT) only, and other elements can be adopted.

In summary, the present disclosure provides a method for reducing power consumption of source drivers and related apparatus. The loading end of the source driver is first charged (or discharged) to the reference voltage close to the target voltage, thus the source driver only needs to provide a small bias current to push the same loading within the same time. Therefore, the power consumption of the source driver can be lowered. This effect of the method is more obvious when the target voltage is close to the maximum voltage (AVDD) and the minimum voltage (GNDA). As the sizes and resolution of flat panel displays increases, the power consumption of the present invention can be improved obviously.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A source driver with reduced power consumption comprising:
   a first pin used for inputting a first reference voltage;
   a second pin used for inputting a second reference voltage;
   a first digital-to-analog converter;
   an operational amplifier coupled to the first digital-to-analog converter;
   an output stage;
   a first switch coupled between the first pin and the output stage for controlling whether to electrically couple the output stage to the first pin;
   a second switch coupled between the operational amplifier and the output stage for controlling whether to electrically couple the output stage to the operational amplifier; and
   a third switch coupled between the second pin and the output stage for controlling whether to electrically couple the output stage to the second pin.

2. A source driver with reduced power consumption comprising:
   a first digital-to-analog converter;
   an operational amplifier coupled to the first digital-to-analog converter;

an output stage;
a first switch coupled between the first digital-to-analog converter and the output stage for controlling whether to electrically couple the output stage to the first digital-to-analog converter; and
a second switch coupled between the operational amplifier and the output stage for controlling whether to electrically couple the output stage to the operational amplifier;
wherein the first digital-to-analog converter selects a reference voltage from a plurality of reference voltages to output according to a polarity signal and a gray scale digital data.

3. A source driver with reduced power consumption comprising:
a first digital-to-analog converter;
an operational amplifier coupled to the first digital-to-analog converter;
an output stage;
a second digital-to-analog converter having a first output end and a second output end;
a first switch coupled between the first output end of the second digital-to-analog converter and the output stage for controlling whether to electrically couple the output stage to the first output end of the second digital-to-analog converter;
a second switch coupled between the operational amplifier and the output stage for controlling whether to electrically couple the output stage to the operational amplifier; and
a third switch coupled between the second output end of the second digital-to-analog converter and the output stage for controlling whether to electrically couple the output stage to the second output end of the second digital-to-analog converter;
wherein the first digital-to-analog converter selects a reference voltage from a plurality of reference voltages to output according to a polarity signal and a gray scale digital data;
wherein the second digital-to-analog converter selects a converter reference voltage from a plurality of converter reference voltages and outputs a first reference voltage at the first output end according to the polarity signal and the gray scale digital data;
wherein the second digital-to-analog converter selects another converter reference voltage from the plurality of converter reference voltages and outputs a second reference voltage at the second output end according to the polarity signal and the gray scale digital data.

4. The source driver of claim 3, wherein the plurality of converter reference voltages are a partial set or a complete set of the plurality of reference voltages.

5. The source driver of claim 3, wherein the plurality of converter reference voltages are independent of the plurality of reference voltages.

6. A source driver integrated circuit with reduced power consumption comprising:
a timing controller used for sequentially delaying a first reference voltage in timing to generate a plurality of first voltage signals according to a start signal and for sequentially delaying a second reference voltage in timing to generate a plurality of second voltage signals according to the start signal; and
a plurality of channel groups, each channel group comprising:
a first input end used for receiving the corresponding first voltage signal;
a second input end used for receiving the corresponding second voltage signal;
a third input end used for receiving the start signal; and
a plurality of source drivers, each source driver comprising:
a digital-to-analog converter;
an operational amplifier coupled to the digital-to-analog converter;
an output stage;
a first switch coupled between the operational amplifier and the output stage for controlling whether to electrically couple the output stage to the operational amplifier;
a second switch coupled between the second input end and the output stage for controlling whether to electrically couple the output stage to the second input end; and
a third switch coupled between the first input end and the output stage for controlling whether to electrically couple the output stage to the first input end.

7. The source driver integrated circuit of claim 6, wherein the timing controller comprises:
a first input end used for receiving the first reference voltage;
a second input end used for receiving the second reference voltage;
a control end used for receiving the start signal;
a plurality of first output ends used for sequentially delaying the first reference voltage in timing to generate the plurality of first voltage signals according to the start signal; and
a plurality of second output ends used for sequentially delaying the second reference voltage in timing to generate the plurality of second voltage signals according to the start signal.

8. The source driver integrated circuit of claim 7, wherein the timing controller comprises:
a plurality of first voltage control switches, each first voltage control switch coupled between the first input end of the timing controller and the corresponding first output end; and
a plurality of second voltage control switches, each second voltage control switch coupled between the second input end of the timing controller and the corresponding second output end.

9. The source driver integrated circuit of claim 8, wherein the timing controller further comprises a phase control unit, the phase control unit comprising:
an input end used for receiving the start signal;
a plurality of first phase control signal output ends used for outputting the plurality of first phase control signals according to the start signal; and
a plurality of second phase control signal output ends used for outputting the plurality of second phase control signals according to the start signal;
wherein the plurality of first phase control signals are used for controlling turning on or off the plurality of corresponding first voltage control switches, and the plurality of second phase control signals are used for controlling turning on or off the plurality of corresponding second voltage control switches.

10. The source driver of claim 1, wherein a first reference voltage source connected to the first pin charges a loading end of the source driver to the first reference voltage having a polarity the same as a polarity of a first target voltage and a voltage level near a voltage level of the first target voltage.

11. The source driver of claim 10, wherein the output stage charges or discharges the loading end to the first target voltage.

12. The source driver of claim 11, wherein a second reference voltage source connected to the second pin discharges the loading end to the second reference voltage having a polarity the same as a polarity of a second target voltage and a voltage level near a voltage level of the second target voltage.

13. The source driver of claim 12, wherein the output stage charges or discharges the loading end to the second target voltage.

14. The source driver of claim 11, wherein the second target voltage is a system ground voltage.

15. The source driver of claim 14, wherein the second reference voltage is one-fourth of a system supply voltage.

16. The source driver of claim 11, wherein the first digital-to-analog converter:
   generates and provides the first reference voltage to the first reference voltage source; and
   generates and provides the second reference voltage to the second reference voltage source.

17. The source driver of claim 16, wherein the first digital-to-analog converter is shared with the output stage.

18. The source driver of claim 16, wherein the first digital-to-analog converter is not shared with the output stage.

19. The source driver of claim 10, wherein the first target voltage is a system supply voltage.

20. The source driver of claim 16, wherein the first reference voltage is three-fourths of the system supply voltage.

* * * * *